US012713607B2

(12) United States Patent
Li et al.

(10) Patent No.: US 12,713,607 B2
(45) Date of Patent: Aug. 18, 2026

(54) MERGING SCHEMES IN SEMICONDUCTIVE DEVICES

(71) Applicant: Yangtze Memory Technologies Co., Ltd., Wuhan (CN)

(72) Inventors: Beibei Li, Wuhan (CN); Bin Yuan, Wuhan (CN); Zongke Xu, Wuhan (CN); Xiangning Wang, Wuhan (CN); Wei Xu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 349 days.

(21) Appl. No.: 18/389,652

(22) Filed: Dec. 19, 2023

(65) Prior Publication Data

US 2025/0159881 A1 May 15, 2025

(30) Foreign Application Priority Data

Nov. 14, 2023 (CN) ......................... 202311530623.5

(51) Int. Cl.
*H10B 43/27* (2023.01)

(52) U.S. Cl.
CPC .................................... *H10B 43/27* (2023.02)

(58) Field of Classification Search
None
See application file for complete search history.

(56) References Cited

U.S. PATENT DOCUMENTS 5,375,085 A 12/1994 Gnade et al.
5,915,167 A 6/1999 Leedy
7,463,502 B2 12/2008 Stipe
10,283,493 B1 5/2019 Nishida
10,354,980 B1 7/2019 Mushiga et al.
12,002,788 B2 6/2024 Liu et al.
2004/0124466 A1 7/2004 Walker et al.
2015/0380418 A1 12/2015 Zhang et al.
2017/0179146 A1 6/2017 Park et al.
2025/0364413 A1* 11/2025 Zhang ................. H10W 20/435

FOREIGN PATENT DOCUMENTS

WO WO 2019037403 A1 2/2019

* cited by examiner

*Primary Examiner* — Jack S Chen
(74) *Attorney, Agent, or Firm* — Fish & Richardson P.C.

(57) ABSTRACT

The present disclosure relates methods, devices, systems, and techniques for merging schemes in semiconductor devices such as three-dimensional (3D) semiconductor devices. In one aspect, a semiconductor device includes a semiconductor structure that includes a stack of conductive layers and insulating layers alternating with each other along a first direction. The semiconductor structure includes an array region and a connection region adjacent to the array region in a second direction perpendicular to the first direction. The semiconductor device further includes multiple contact structures extending through the connection region along the first direction. Each conductive layer in the stack of conductive layers and insulating layers is coupled to a corresponding contact structure of the multiple contact structures and isolated from one or more other contact structures of the multiple contact structures. Each contact structure of the multiple contact structures includes a body and a head extending beyond the body.

6 Claims, 30 Drawing Sheets

MERGING SCHEMES IN SEMICONDUCTIVE DEVICES

CROSS-REFERENCE TO RELATED APPLICATIONS

This application claims priority to Chinese Patent Application No. 202311530623.5, filed on Nov. 14, 2023, which is hereby incorporated by reference in its entirety.

TECHNICAL FIELD

The present disclosure relates to semiconductor devices and fabrication processes for semiconductor devices.

BACKGROUND

Semiconductor devices, e.g., memory devices, can have various structures to increase a density of memory cells and lines on a chip. For example, three-dimensional (3D) memory devices are attractive due to their capability to increase an array density by stacking more layers within a similar footprint. A 3D memory device normally includes a memory array of memory cells and peripheral circuits for facilitating operations of the memory array.

SUMMARY

The present disclosure describes methods, devices, systems and techniques for merging schemes in semiconductor devices, e.g., 3D memory devices.

One aspect of the present disclosure features a semiconductor device including a semiconductor structure. The semiconductor structure includes a stack of conductive layers and insulating layers alternating with each other along a first direction. The semiconductor structure can include an array region and a connection region adjacent to the array region in a second direction perpendicular to the first direction. The semiconductor device further includes multiple contact structures extending through the connection region along the first direction. Each conductive layer in the stack of conductive layers and insulating layers is coupled to a corresponding contact structure of the multiple contact structures and isolated from one or more other contact structures of the multiple contact structures. Each contact structure of the multiple contact structures includes a body and a head extending beyond the body. An end of the head is in contact with an end of the body. The end of the body is wider than the end of the head.

In some implementations, the head is shaped like a truncated cone, and a diameter of the head is gradually reduced from a surface of the head to the end of the head along the first direction.

In some implementations, the body includes an outer layer, an inner layer, and an intermediate layer between the outer layer and the inner layer. The head includes an outer layer, an inner layer, and an intermediate layer between the outer layer and the inner layer. The outer layer of the body, the intermediate layer of the body, and the inner layer of the body are continuously connected with the outer layer of the head, the intermediate layer of the head, and the inner layer of the head, respectively.

In some implementations, the outer layer of the body includes a high-k dielectric material, the intermediate layer of the body includes a titanium nitride material, the inner layer of the body includes a conductive material, the outer layer of the head includes a high-k dielectric material, the intermediate layer of the head includes a titanium nitride material, and the inner layer of the head includes a conductive material.

In some implementations, the outer layer of the head, the intermediate layer of the head, and the inner layer of the head are filled in the end, and the body includes a hollow region surrounded by the inner layer of the body.

In some implementations, the contact structure extends through a set of conductive layers of the stack of conductive layers and insulating layers. The contact structure is in contact with one conductive layer of the set of conductive layers that is closest to the head of the contact structure among the set of conductive layers. A contact spacer comprising a dielectric material is located between the contact structure and one or more other conductive layers of the set of conductive layers that are isolated from the contact structure.

In some implementations, the protective layer includes a first part extending along the first direction and covering a side of the set of conductive layers and one or more insulating layers in between the set of conductive layers. The protective layer further includes a second part extending along the second direction in parallel with and in contact with the one conductive layer.

In some implementations, the body of the contact structure is connected to the one conductive layer through a connection part. The connection part includes a same material as the body of the contact structure and the one conductive layer. The connection part is in contact with the one conductive layer, the second part of the protection layer, and a contact spacer located between the body of the contact structure and the one conductive layer.

In some implementations, the semiconductor structure includes one or more decks that are sequentially stacked together along the first direction. The body of the contact structure includes one or more segments that are sequentially connected together along the first direction. Each of the one or more segments is shaped like a truncated cone and corresponds to a respective deck of the one or more decks of the semiconductor structure.

In some implementations, each of the one or more segments of the body has a diameter gradually reduced along the first direction.

In some implementations, the semiconductor device further includes gate line slits and channel structures both extending through the semiconductor structure along the first direction.

In some implementations, the channel structures include first channel structures in the array region and second channel structures in the connection region.

In some implementations, the end of the contact structure is a first end. The contact structure includes a second end opposite to the first end along the first direction. The contact structure is coupled out of the semiconductor structure to an external conductive contact at the first end or the second end.

Another aspect of the present disclosure features a method including providing a semiconductor structure that includes sacrificial layers and insulating layers alternating with each other along a first direction. The semiconductor structure includes one or more decks sequentially stacked in the first direction. Each deck of the one or more decks includes a subset of the sacrificial layers and the insulating layers. The semiconductor structure includes an array region and a connection region adjacent to the array region in a second direction perpendicular to the first direction. The method further includes forming: a) first gate line holes in the array region, b) second gate line holes and contact holes in the connection region, c) first channel holes in the array region, and d) second channel holes in the connection region. The first gate line holes, the second gate line holes, the contact holes, the first channel holes, and the second channel holes extend through the semiconductor structure along the first direction. The first gate line holes, the second gate line holes, the contact holes, the first channel holes, and the second channel holes in each deck of the one or more decks are formed during a same etching process.

In some implementations, the first gate line holes, the second gate line holes, the first channel holes, the second channel holes, and the contact holes are formed using a single etching mask.

In some implementations, each of the sacrificial layers includes silicon nitride, and each of the insulating layers includes silicon oxide.

In some implementations, each gate line hole of the first gate line holes and the second gate line holes has a cross section of a round shape or an ellipse shape.

In some implementations, the contact holes in each deck of the one or more decks include truncated cones that taper along the first direction.

In some implementations, the connection region includes an isolation structure, and a protective layer is formed between the isolation structure and the sacrificial layers.

In some implementations, the isolation structure has a staircase-like shape.

In some implementations, the isolation structure includes silicon oxide, and the protective layer includes a nitrogen-doped carbide (NDC) material.

In some implementations, the method further includes filling the first channel holes, the second channel holes, the first gate line holes, the second gate line holes, and the contact holes with a polysilicon material.

In some implementations, the method further includes forming channel structures in the first channel holes and the second channel holes.

In some implementations, the method further includes etching and recessing the sacrificial layers exposed by the contact holes using a first etchant having a faster etching rate for the sacrificial layers than the protective layer. The method further includes forming a contact spacer layer in each of the contact holes. The contact spacer layer is in contact with the recessed sacrificial layers. The method further includes etching and recessing the protective layer exposed by each of the contact holes using a second etchant having a faster etching rate for the protective layer than the contact spacer layer in each of the contact holes.

In some implementations, the contact spacer layer includes silicon oxide.

In some implementations, the method further includes filling the contact holes with a sacrificial material. The method further includes polishing a top surface of the semiconductor structure and depositing an isolating layer on the top surface of the semiconductor structure.

In some implementations, a depth of the isolating layer is about 100 nanometers (nm).

In some implementations, the method further includes forming a gate line opening in the isolating layer for each of the first and second gate line holes to expose the first and second gate line holes. The method further includes removing the polysilicon material in the first and second gate line holes. The method further includes expanding the first and second gate line holes to form multiple gate line trenches extending in the second direction. Each of the multiple gate line trenches includes a series of expanded gate line holes connected with each other along the second direction.

In some implementations, the method further includes oxidizing a bottom surface of each of the multiple gate line trenches. The bottom surface is in a substrate of the semiconductor structure.

In some implementations, the method further includes forming a contact opening in the isolating layer for each contact hole of the contact holes. A width of the contact opening is smaller than a width of the contact hole. The method further includes removing the sacrificial material in the contact holes.

In some implementations, the width of the contact opening is about 40 nm.

In some implementations, the method further includes removing the sacrificial layers in the semiconductor structure.

In some implementations, the method further includes depositing at least one conductive material into the multiple gate line trenches and the contact holes to form conductive layers between the insulating layers and contact structures extending through the connection region of the semiconductor structure in the first direction. Each conductive layer of the conductive layers is connected to a corresponding contact structure of the contact structures and is isolated from one or more other contact structures of the contact structures. Each contact structure of the contact structures includes a body and a head extending beyond the body. An end of the head is in contact with an end of the body. The end of the body is wider than the end of the head.

In some implementations, the conductive material comprises tungsten.

In some implementations, the method further includes etching an inner surface of each of the multiple gate line trenches to expose and recess the conductive layers. The method further includes etching a part of the end of each of the contact structures without creating an opening in each of the contact structures. The method further includes depositing a spacer layer. The spacer layer covers the inner surface of each of the multiple gate line trenches to isolate the conductive layers from each other. The spacer layer further covers the end of each of the contact structures.

A further aspect of the present disclosure features a method including providing a semiconductor structure including sacrificial layers and insulating layers alternating with each other along a first direction. The semiconductor structure has an array region and a connection region adjacent to the array region along a second direction perpendicular to the first direction. The semiconductor structure includes gate line trenches and contact holes. The contact holes extend through the connection region of the semiconductor structure along the first direction. The connection region includes an isolating structure and a protective layer formed between the isolating structure and the sacrificial layers. The method further includes etching and recessing the sacrificial layers exposed by the contact holes using a first etching solution having a faster etching rate for the sacrificial layers than the protective layer. The method further includes forming a contact spacer layer in each of the contact holes. The contact spacer layer is in contact with the recessed sacrificial layers. The method further includes etching and recessing the protective layer exposed by each of the contact holes using a second etching solution having a faster etching rate for the protective layer than the contact spacer layer in each of the contact holes.

In some implementations, the method further includes forming a contact opening for each of the contact holes. A width of the contact opening is smaller than a width of the contact hole. the method further includes removing the sacrificial layers in the semiconductor structure. The method further includes depositing at least one conductive material into the gate line trenches and the contact holes in a conformal deposition process to form conductive layers and contact structures.

In some implementations, each contact structure of the contact structures includes a first end and a second end opposite to the first end along the first direction. The method further includes coupling the contact structure out of the semiconductor structure to an external conductive contact at the first end or the second end.

Implementations of the present disclosure can provide one or more of the following technical advantages and/or benefits. For example, gate line holes, contact holes, and channel holes in a deck of a semiconductor structure can be formed during a same etching process using a same mask. Thus, the techniques enable to reduce fabrication cost (e.g., using fewer etching steps and masks) and fabrication difficulty, especially when the semiconductor structure includes multiple decks. In addition, contact structures of the semiconductor structure can be coupled out to an external component either at a front side of the semiconductor structure, or at a back side, or both. As a result, a peripheral circuit (e.g., a complementary metal-oxide-semiconductor (CMOS) control circuit of a memory array) can be folded and located at both sides of the semiconductor structure, which reduces a size of the peripheral circuit (e.g., in a lateral surface) and makes the circuit design more flexible. The techniques also provide a method to form a narrow opening on top of each contact hole of the semiconductor structure. Due to the size of these openings, conductive layers and the contact structures of the semiconductor structure can be formed in a same deposition process, which may further reduce the fabrication cost. Specifically, a head structure formed in each of the narrow openings can prevent the contact structures from being recessed during an etching process (e.g., for separating the conductive layers from each other).

The techniques can be applied to various types of semiconductor devices, volatile memory devices, such as DRAM memory devices, or non-volatile memory (NVM) devices, such as NAND flash memory, NOR flash memory, resistive random-access memory (RRAM), phase-change memory (PCM) such as phase-change random-access memory (PCRAM), spin-transfer torque (STT)-Magnetoresistive random-access memory (MRAM), among others. The techniques can also be applied to charge-trapping based memory devices, e.g., silicon-oxide-nitride-oxide-silicon (SONOS) memory devices, and floating-gate based memory devices. The techniques can be applied to three-dimensional (3D) memory devices. The techniques can be applied to various memory types, such as SLC (single-level cell) devices, MLC (multi-level cell) devices like 2-level cell devices, TLC (triple-level cell) devices, QLC (quad-level cell) devices, or PLC (penta-level cell) devices. Additionally or alternatively, the techniques can be applied to various types of devices and systems, such as secure digital (SD) cards, embedded multimedia cards (eMMC), or solid-state drives (SSDs), embedded systems, among others.

The details of one or more implementations of the subject matter of this present disclosure are set forth in the accompanying drawings and the description below. Other features, aspects, and advantages of the subject matter will become apparent from the description, the drawings, and the claims.

BRIEF DESCRIPTION OF THE DRAWINGS

The accompanying drawings, which are incorporated herein and form a part of the present disclosure, illustrate aspects of the present disclosure and, together with the description, further serve to explain the principles of the present disclosure and to enable a person of ordinary skill in the pertinent art to make and use the present disclosure.

Like reference numbers and designations in the various drawings indicate like elements. It is also to be understood that the various exemplary implementations shown in the figures are merely illustrative representations and are not necessarily drawn to scale.

DETAILED DESCRIPTION

Figure 1A:
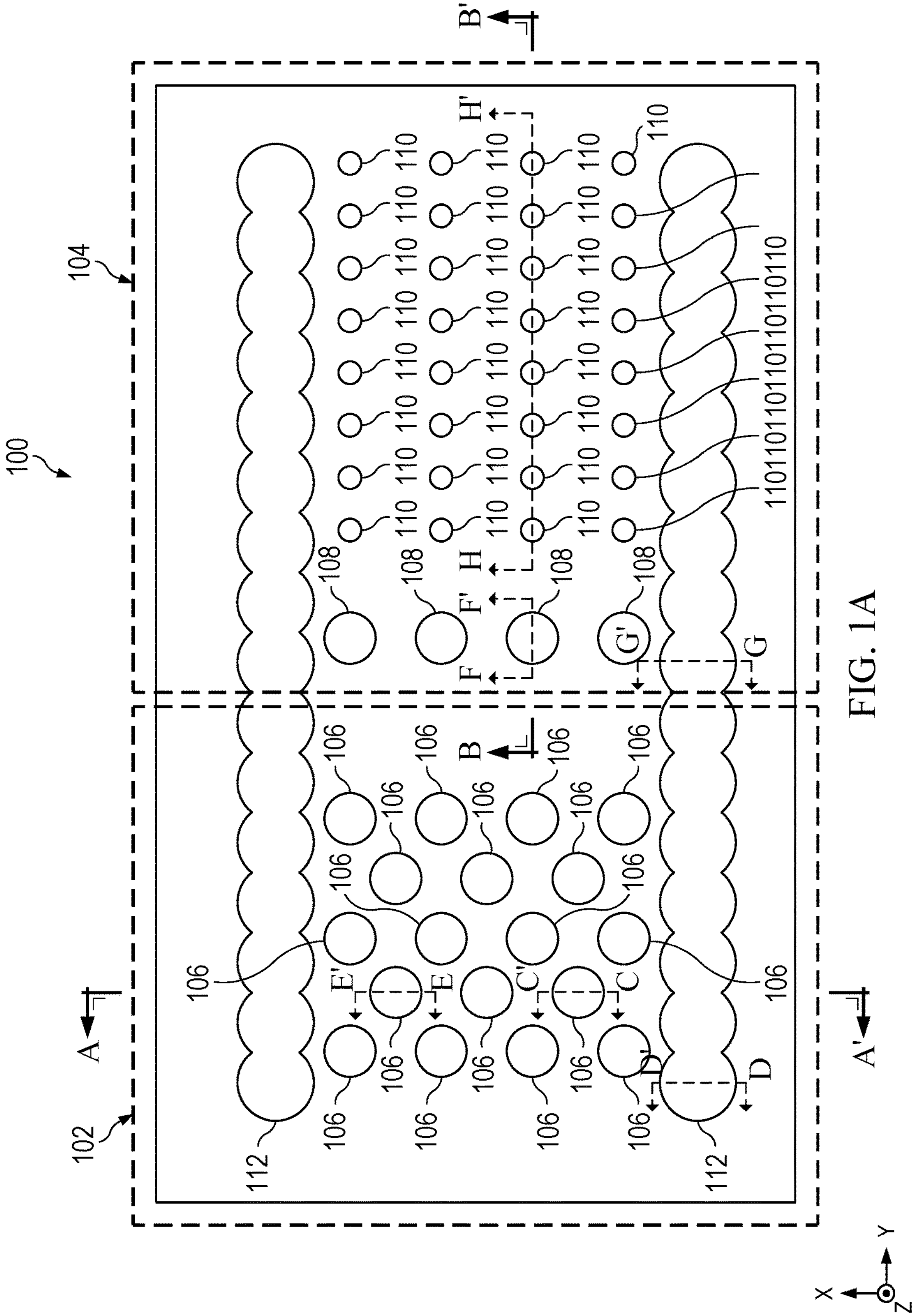
FIG. 1A illustrates a top view of an example semiconductor device, according to some aspects of the present disclosure.
Figure 1B:
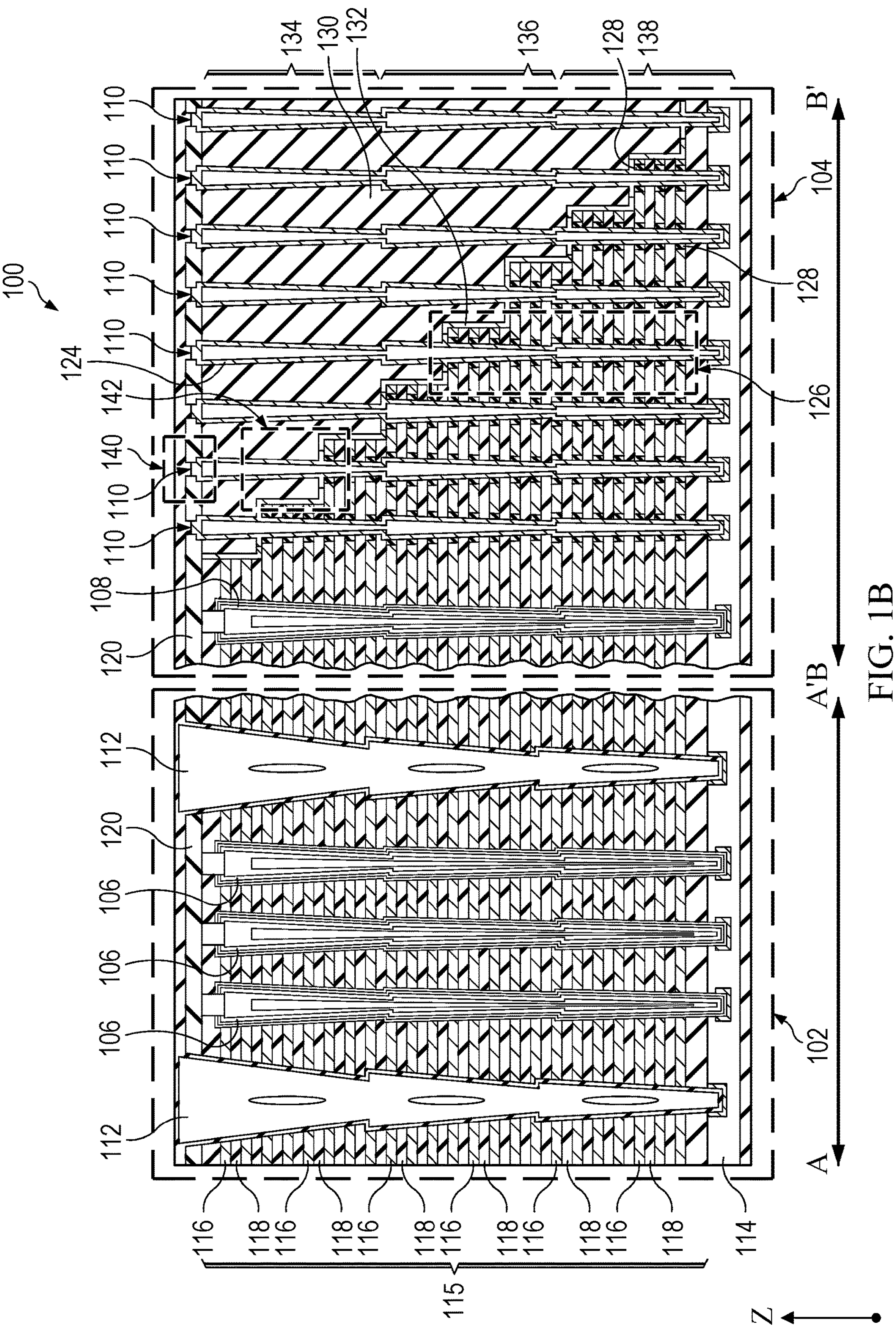
FIG. 1B illustrates cross-sectional views of the semiconductor device of FIG. 1A, according to some aspects of the present disclosure.

FIGS. 1A-1B illustrate an example semiconductor device 100, according to some aspects of the present disclosure. The semiconductor device 100 can be used to form a memory device, e.g., a 3D NAND memory device.

It is noted that X, Y, and Z axes (also referred to as X, Y, and Z directions) are included in FIGS. 1A-1B to further illustrate the spatial relationship of various components in a semiconductor device. A substrate of the semiconductor device includes two lateral surfaces extending laterally in the X-Y plane: a top surface on the front side of a wafer on which a component of the semiconductor device can be formed, and a bottom surface on the backside opposite to the front side of the wafer. The Z direction is perpendicular to both the X and Y directions. As used herein, whether one component (e.g., a layer or a device) is "on," "above," or "below" another component (e.g., a layer or a device) of the semiconductor device is determined relative to the substrate of the semiconductor device in the Z direction (the vertical direction perpendicular to the X-Y plane, e.g., the thickness direction of the substrate) when the substrate is positioned in the lowest plane of the semiconductor device in the Z direction. The same notion for describing the spatial relationships is applied throughout the present disclosure.

FIG. 1A illustrates a top view of the semiconductor device 100, according to some aspects of the present disclosure. The semiconductor device 100 includes an array region 102 and a connection region 104. The connection region 104, which can also be referred to as a staircase region, is adjacent to the array region 102 in a horizontal direction (e.g., the Y direction). The array region 102 includes an array of channel structures 106. Each channel structure 106 can be used to form a string of memory cells coupled in serial along a vertical direction (e.g., the Z direction) perpendicular to the X-Y plane. The connection region 104 includes channel structures 108 and contact structures 110. The channel structures 108 in the connection region 104 can also be referred to as dummy channel structures. The semiconductor device 100 includes gate line slits 112 extending through both of the array region 102 and the connection region 104 along the Y direction. In some implementations, a gate line slit in the connection region 104 has a greater width (in the X direction) than a gate line slit in the array region 102. In some implementations, a gate line slit in the connection region 104 has a same width as a gate line slit in the array region 102. In some implementations, a gate line slit in the connection region 104 has a smaller width than a gate line slit in the array region 102. FIG. 1A further shows cut lines AA' and BB' for generating cross-sectional views in FIG. 1B.

FIG. 1B illustrates cross-sectional views of the semiconductor device 100 (a cross-sectional view of the array region 102 along line AA' and a cross-sectional view of the connection region 104 along line BB'), according to some aspects of the present disclosure. As shown in FIG. 1B, the semiconductor device 100 includes a substrate 114 and a stack 115 of conductive layers 116 and insulating layers 118 provided over the substrate 114. The substrate 114 can be any suitable semiconductor substrate having any suitable semiconductor materials, such as monocrystalline, polycrystalline or single crystalline semiconductors. For example, the substrate 114 can include silicon, silicon germanium (SiGe), germanium (Ge), gallium arsenide (GaAs), silicon on insulator (SOI), germanium on insulator (GOI), gallium nitride, silicon carbide, III-V compound, or any combinations thereof.

The stack 115 can extend in the X-Y plane in parallel with a top surface of the substrate 114. The conductive layers 116 and the insulating layers 118 can alternate in the vertical direction (e.g., the Z direction) perpendicular to the X-Y plane. The conductive layers 116 and the insulating layers 118 can extend from the array region 102 into the connection region 104 and be arranged in a staircase-like structure in the connection region 104. The conductive layers 116 can be the same or different from each other in thickness, for example, ranging from 10-500 nanometers (nm), e.g., about 35 nm. The insulating layers 118 can also be the same or different from each other in thickness, for example, ranging from 10-500 nm, e.g., about 25 nm. The conductive layers 116 can include any suitable conducting material, such as tungsten (W), cobalt (Co), copper (Cu), aluminum (Al), titanium nitride (TiN), polycrystalline silicon (polysilicon), doped silicon, silicides, or any combination thereof. The insulating layers 118 can include a dielectric material, such as silicon oxide, silicon nitride, silicon oxynitride, or any combination thereof. In some implementations, the insulating layers 118 can also include high-k dielectric materials, such as hafnium oxide, zirconium oxide, aluminum oxide, tantalum oxide, lanthanum oxide, or any combination thereof. It should be noted that the number of the conductive layers 116 and the insulating layers 118 shown in FIG. 1B is for illustration only and that any suitable number of conductive layers and insulating layers can be included in the semiconductor device 100.

The semiconductor device 100 further includes a spacer layer 120 provided over the stack 115. The spacer layer 120 extends in the X-Y plane in parallel with the substrate 114 and the stack 115 of conductive layers 116 and insulating layers 118. The spacer layer 120 can include a dielectric material (e.g., silicon oxide). In some implementations, a thickness of the spacer layer 120 can be about 100 nm.

As shown in FIG. 1B, each contact structure 110 has a head 122 and a body 124. The contact structures 110 can extend through the connection region 104 along the vertical direction (e.g., the Z direction). Specifically, the head 122 of the contact structure 110 can extend through the spacer layer 120, and a bottom end of the body 124 can extend through the substrate 114. Due to the staircase-like structure formed by the stack 115 in the connection region 104, the body 124 can extend through a portion of the stack 115, which is included in a step of the staircase-like structure (e.g., step 126 as shown in FIG. 1B).

The staircase-like structure formed by the conductive layers 116 and insulating layers 118 allow the contact structures 110 to connect the conductive layers 116 to external components. Each conductive layer 116 can be coupled to a corresponding contact structure and can be isolated from one or more other contact structures. In some implementations, each contact structure 110 can be coupled to a respective conductive layer. The contact structure 110 can extend through a set of conductive layers of the stack 115. The contact structure 110 can be in contact with one conductive layer that is closest to the head 122 of the contact structure 110 among the set of conductive layers. For example, as shown in FIG. 1B, each contact structure 110 can extend through conductive layers in a staircase step (e.g., step 126) and can be coupled to a topmost conductive layer in that staircase step. One or more contact spacers (e.g., contact spacers 128) can be located between the contact structure 110 and one or more other conductive layers of the set of conductive layers and can isolate the contact structure 110 from these conductive layers. Each contact spacer can include a dielectric material. In some other implementations (not shown in FIG. 1B), each contact structure 110 can be coupled to multiple conductive layers 116. In some implementations, the contact structure 110 can be coupled out either through the head 122 to a conductive contact on a top surface of the semiconductor device 100, or through the bottom end of the body 124 to a conductive contact on a bottom surface of the semiconductor device 100, or both.

The connection region 104 further includes an isolation structure 130 and a protective layer 132 formed between the isolation structure 130 and the stack 115. The protective layer 132 can cover top and side surfaces of the staircase-like shape formed by the stack 115 in the connection region 104. The isolation structure 130 can include a dielectric material such as silicon oxide. The protective layer 132 can include a nitrogen-doped carbide (NDC) material.

As shown in FIG. 1B, the semiconductor device 100 include 3 decks 134, 136, and 138 sequentially stacked together vertically (i.e., along the Z direction). Each deck includes a respective subset of conductive layers and insulating layers of the stack 115. The body 124 of each contact structure 110 includes 3 segments each formed in a corresponding deck. The 3 segments of the body 124 are sequentially connected together along the vertical direction. Each segment of the body 124 can be shaped like a pillar or a truncated cone and can have a diameter gradually reduced along the vertical direction from top to bottom. At an intersection of two adjacent decks, a top of a lower segment of the body 124 can have a larger diameter than a bottom of an upper segment of the body 124. For example, for each contact structure 110, a top of a segment of its body in deck 138 is thicker than a bottom of another segment of its body in deck 136. It should be noted that the 3 decks shown in FIG. 1B are for illustration purposes only and that any suitable number (including one) of decks can be included in the semiconductor device 100.

The channel structures 106 and the dummy channel structures 108 extend through the stack 115 along the vertical direction (e.g., the Z direction). Each channel structure 106 can have one or more segments. Each of the one or more segments is in a corresponding deck of the semiconductor device 100 and is shaped like a pillar or a truncated cone. The channel structure 106 can include a memory film and a semiconductor channel. In some examples, the memory film includes a blocking layer, a charge trapping layer and a tunneling layer. In some examples, a material for the blocking layer may include silicon oxide, silicon nitride, silicon oxynitride, and a high-k dielectric material such as aluminum oxide or hafnium oxide; a material for the charge trapping layer may include polysilicon, silicon nitride, silicon oxynitride, etc.; and a material for the tunneling layer may include silicon oxide, silicon nitride, silicon oxynitride, a high-k dielectric material such as aluminum oxide or hafnium oxide, etc. In an example, the materials of the blocking layer, the charge trapping layer, the tunneling layer and the semiconductor channel may include silicon oxide, silicon nitride, silicon oxide and polysilicon respectively. Each dummy channel structure 108 may include a structure and materials similar to the channel structure 106. In some implementations, the dummy channel structure 108 can be used to support the stack 115 within the connection region 104.

FIG. 1B shows a cross-sectional view of the gate line slits 112 along line AA'. The gate line slits 112 extend through the stack 115 along the Z direction. The gate line slits 112 can divide the semiconductor device 100 into multiple blocks. Each gate line slit 112 can include a gate line trench filled with a trench filler material (e.g., polysilicon). The gate line trench can be formed in the following process. A series of gate line holes can be formed in the semiconductor device 100 along the Y direction. Each of the gate line holes extends through the semiconductor device along the Z direction. Each of the series of gate line holes can then be expanded (e.g., by etching). Two adjacent gate line holes can connect to each other after expansion, which turns the series of gate line holes into the gate line trench.

Figure 2:
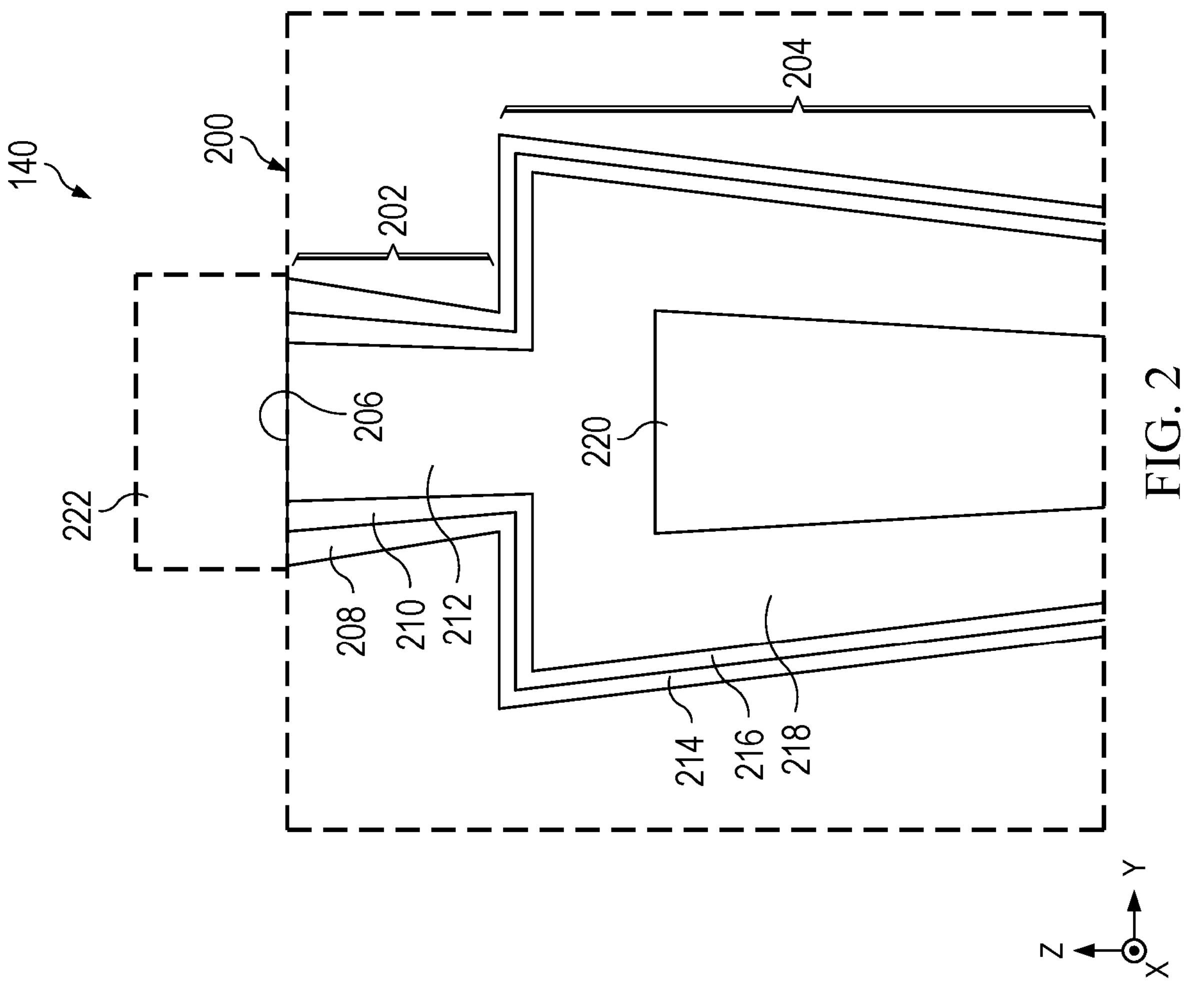
FIG. 2 illustrates an enlarged schematic diagram of an example structure in the semiconductor device of FIG. 1B, according to some aspects of the present disclosure.

FIG. 2 illustrates an enlarged schematic diagram of a structure 140 in the semiconductor device 100 of FIG. 1B, according to some aspects of the present disclosure. The structure 140 shows a part of a contact structure 200. The contact structure 200 can be an example of the contact structure 110 of FIGS. 1A-1B. The contact structure 200 includes a head 202 and a body 204. The head 202 extends beyond the body 204 along the vertical direction (e.g., the Z direction). An end of the head 202 is in contact with an end of the body 204. The end of the body 204 is wider than the end of the head 202 in the horizontal direction (e.g., the Y direction). The head 202 can be shaped like a truncated cone. A diameter of the head 202 can be gradually reduced from a surface (e.g., a top surface 206) of the head 202 towards the body 204 along the vertical direction.

In some implementations, as shown in FIG. 2, the head 202 includes an outer layer 208, an inner layer 212, and an intermediate layer 210 between the outer layer 208 and the inner layer 212. The body 204 also includes an outer layer 214, an inner layer 218, and an intermediate layer 216 between the outer layer 214 and the inner layer 218. The outer layer 214 of the body 204, the intermediate layer 216 of the body 204, and the inner layer 218 of the body 204 are continuously connected with the outer layer 208 of the head 202, the intermediate layer 210 of the head 202, and the inner layer 212 of the head 202, respectively.

In some implementations, each of the outer layer 214 of the body 204 and the outer layer 208 of the head 202 includes a high-k dielectric material. Each of the intermediate layer 216 of the body 204 and the intermediate layer 210 of the head 202 includes a titanium nitride material. Each of the inner layer 218 of the body 204 and the inner layer 212 of the head 202 includes a conductive material such as such as tungsten (W).

In some implementations, as shown in FIG. 2, the outer layer 208 of the head 202, the intermediate layer 210 of the head 202, and the inner layer 212 of the head 202 are filled in the end. The body 204 can include a hollow region 220 surrounded by the inner layer 218.

In some implementations, as shown in FIG. 2, the contact structure 200 can be coupled to a via 222 through the head 202. The via 222 can include a conductive material and can be in contact with the top surface 206 of the head 202.

Figure 3:
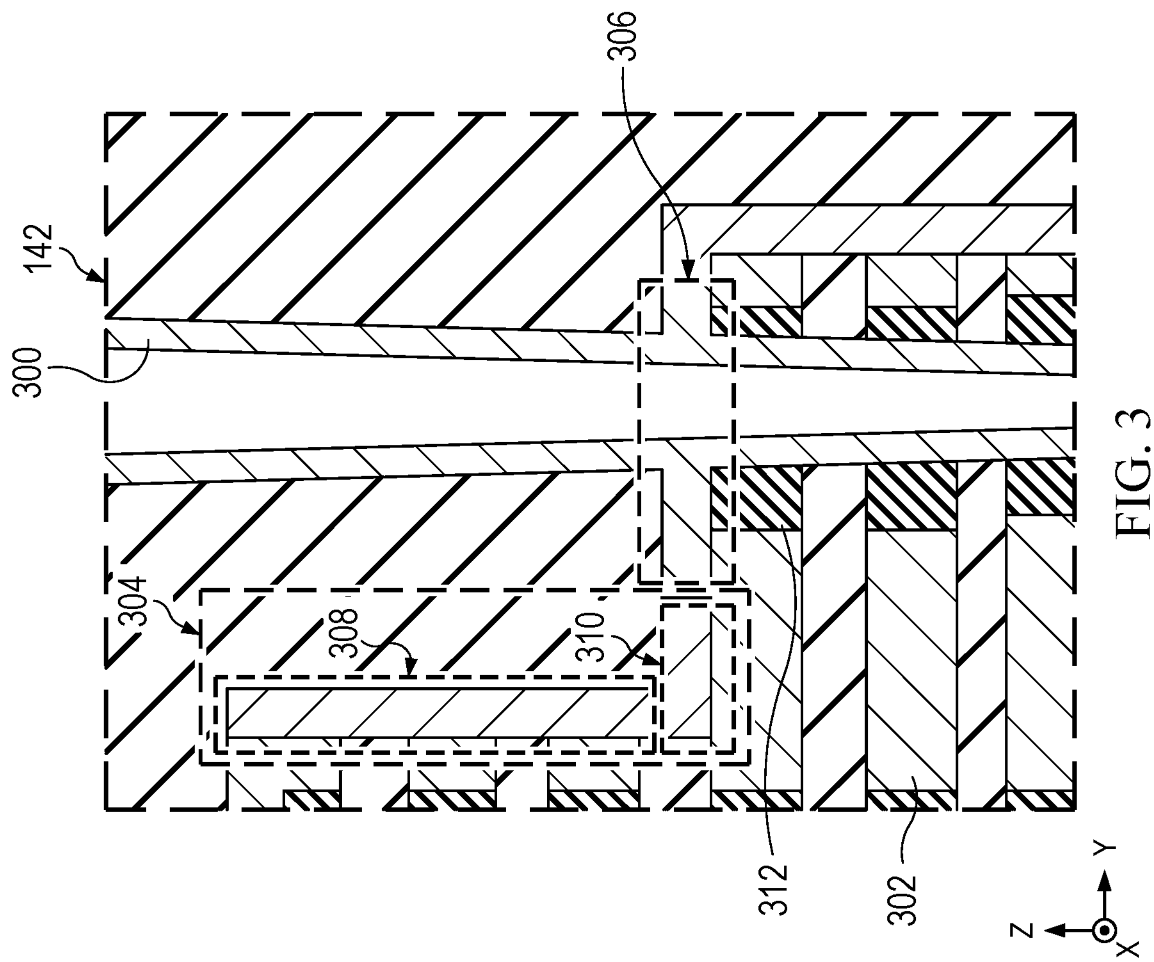
FIG. 3 illustrates an enlarged schematic diagram of another example structure in the semiconductor device of FIG. 1B, according to some aspects of the present disclosure.

FIG. 3 illustrates an enlarged schematic diagram of a structure 142 in the semiconductor device 100 of FIG. 1B, according to some aspects of the present disclosure. The structure 142 shows an example connection of a contact structure 300, a conductive layer 302, and a protective layer 304. The contact structure 300 can be an example of the contact structure 110 of FIG. 1B. The conductive layer 302 can be an example of the conductive layer 116 of FIG. 1B. The protective layer 304 can be an example of the protective layer 132 of FIG. 1B. As shown in FIG. 3, the protective layer 304 includes at least a part 308 and a part 310. The part 308 extends along the vertical direction and covers a side of a set of alternating conductive layers and insulating layers. The part 310 extends along the horizontal direction and is in parallel with and in contact with the conductive layer 302. The contact structure 300 is connected to the conductive layer 302 through a connection part 306. The connection part 306 extends along the horizontal direction. The connection part 306 is in contact with the part 310 of the protective layer 304 in the horizontal direction and in contact with the conductive layer 302 in the vertical direction. The connection part 306 can have substantially the same thickness as the part 310 of the protective layer 304. The connection part 306 can include the same material(s) as the contact structure 300 and the conductive layer 302. A contact spacer 312 is located between the conductive layer 302 and the contact structure 300 in the horizontal direction. The contact spacer 312 is in contact with the connection part 306 in the vertical direction. The contact spacer 312 can be an example of the contact spacer 128 of FIG. 1B.

Figure 4A:
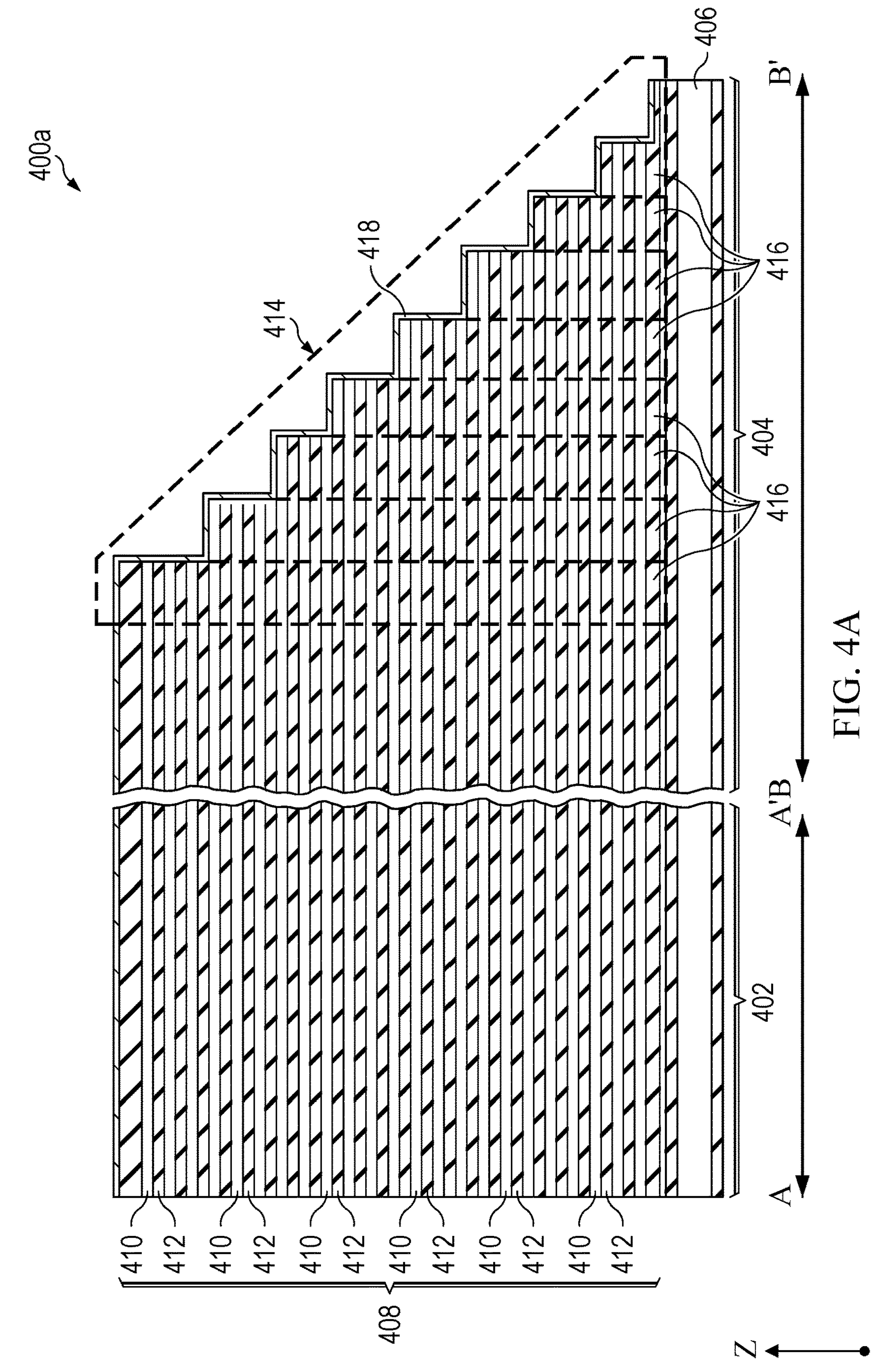
FIGS. 4A-4W illustrate cross-sectional views of example semiconductor structures at various stages of a fabrication process, according to some aspects of the present disclosure.
Figure 4B:
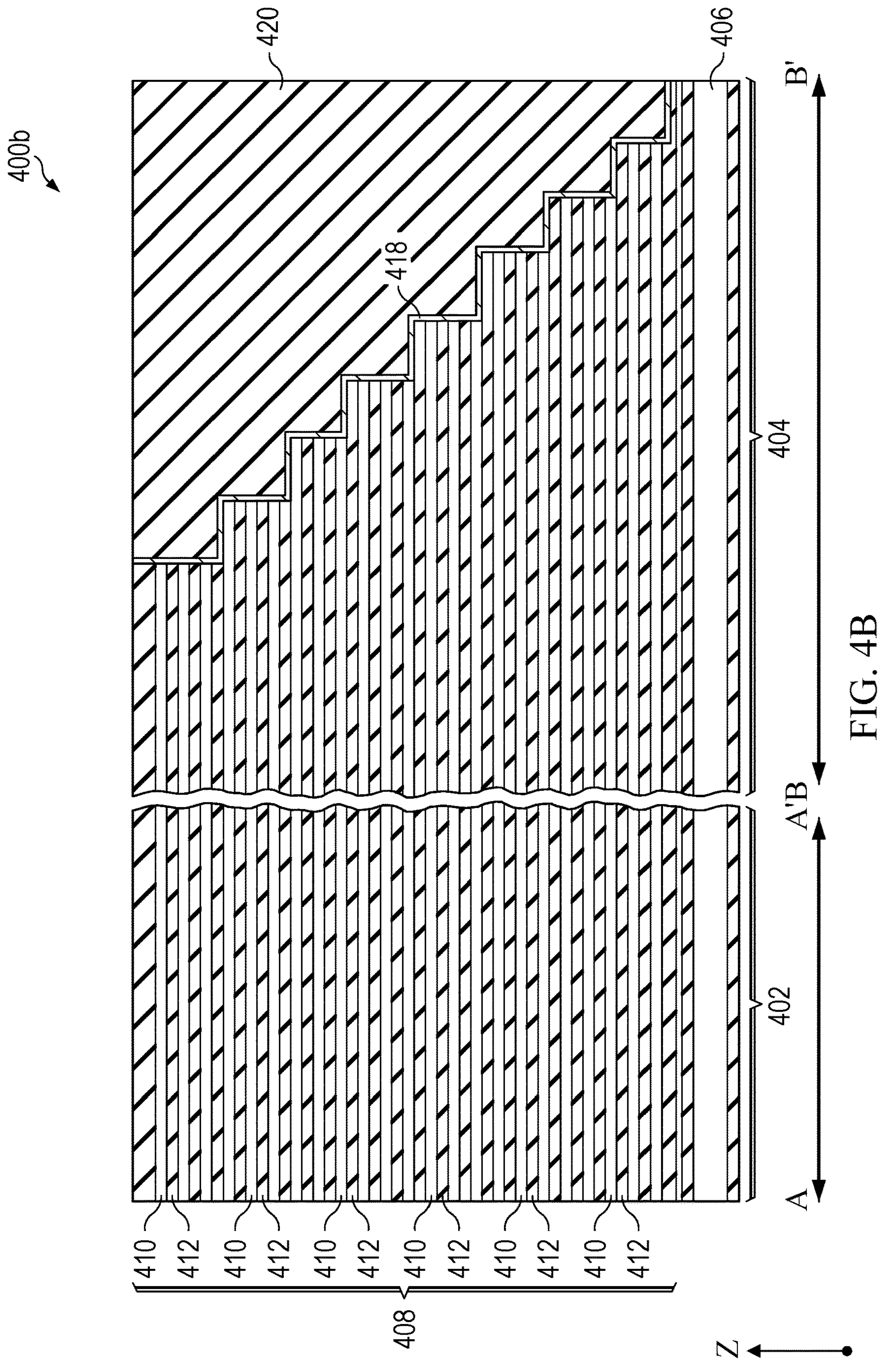
Figure 4C:
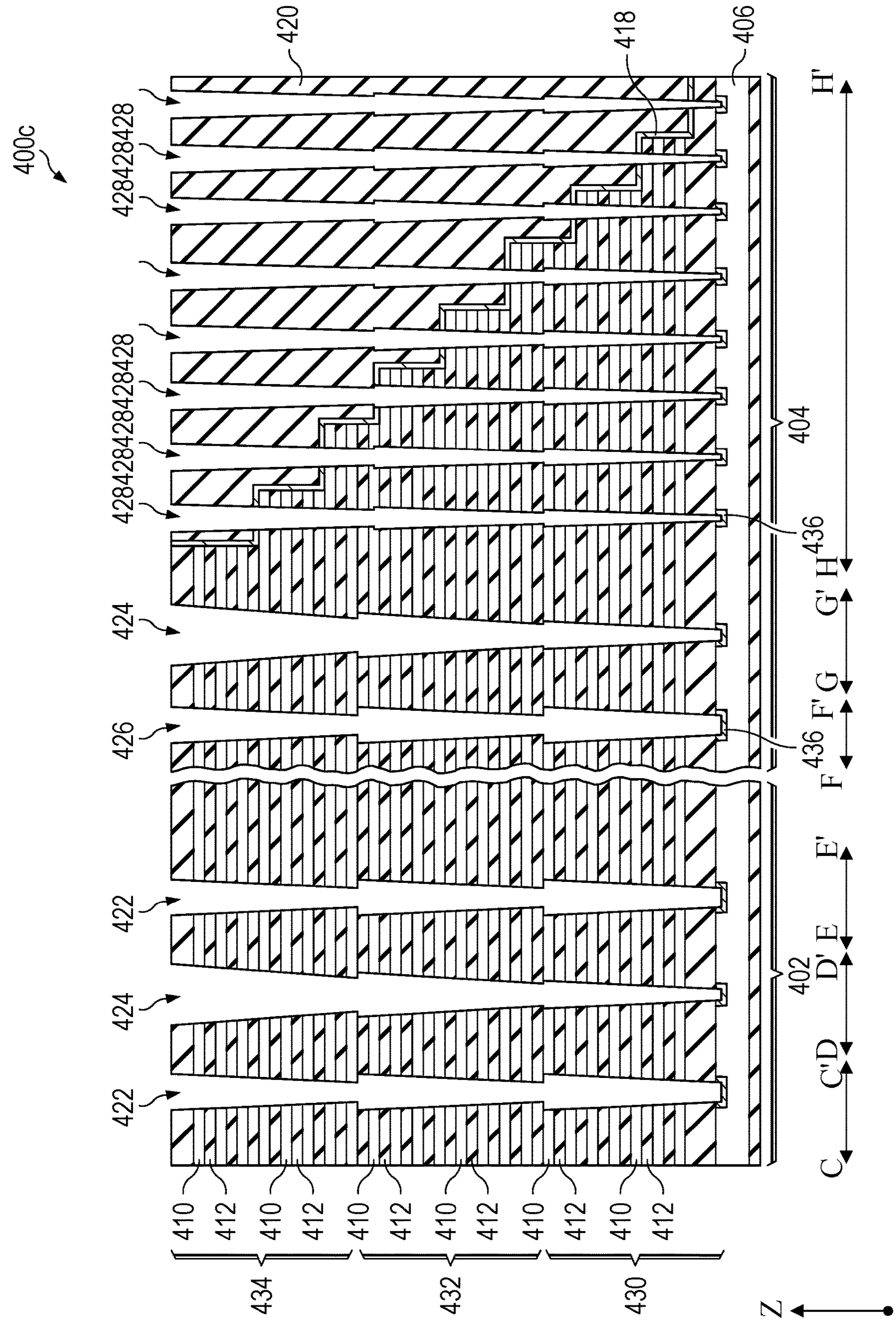
Figure 4D:
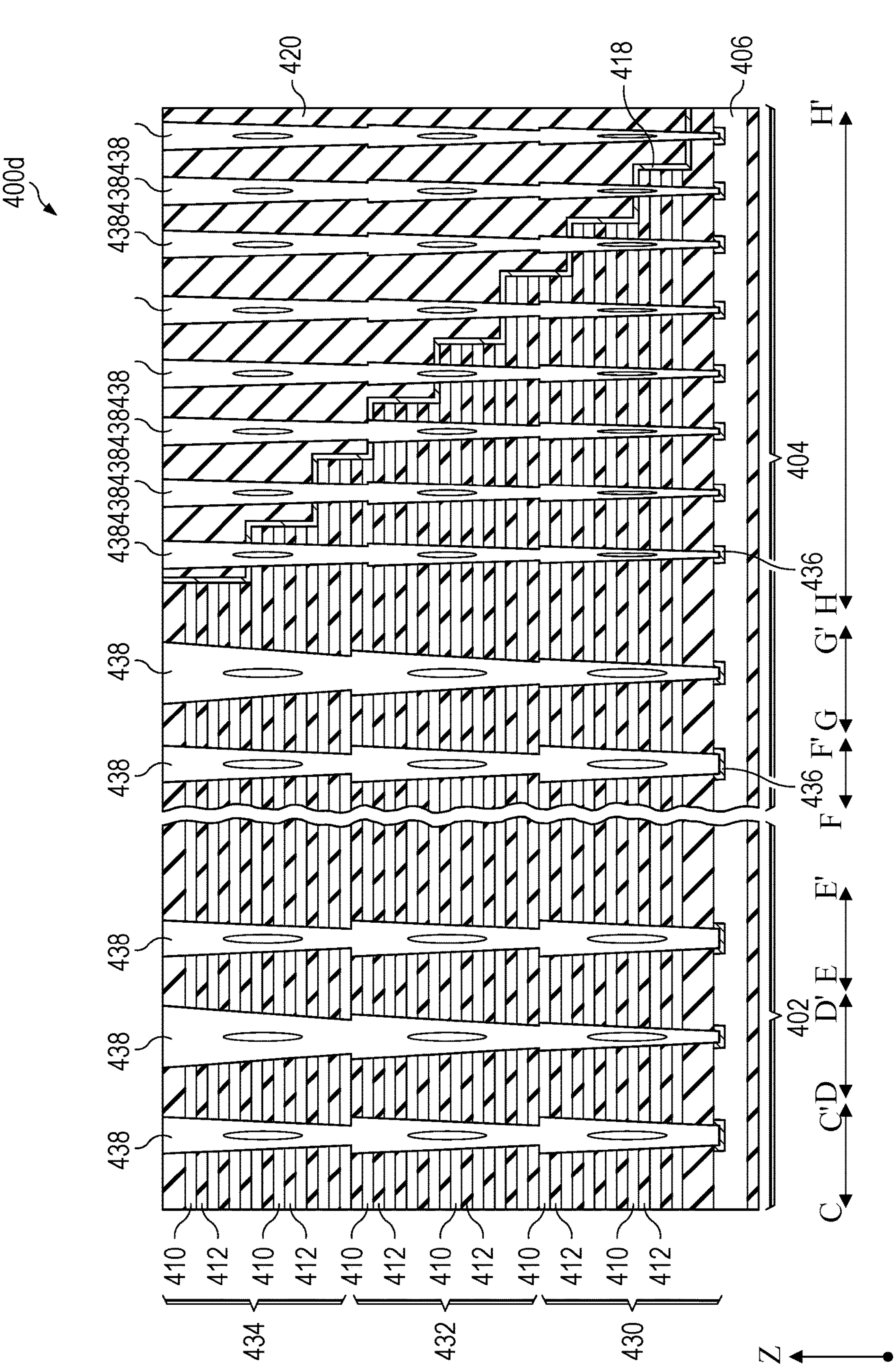
Figure 4E:
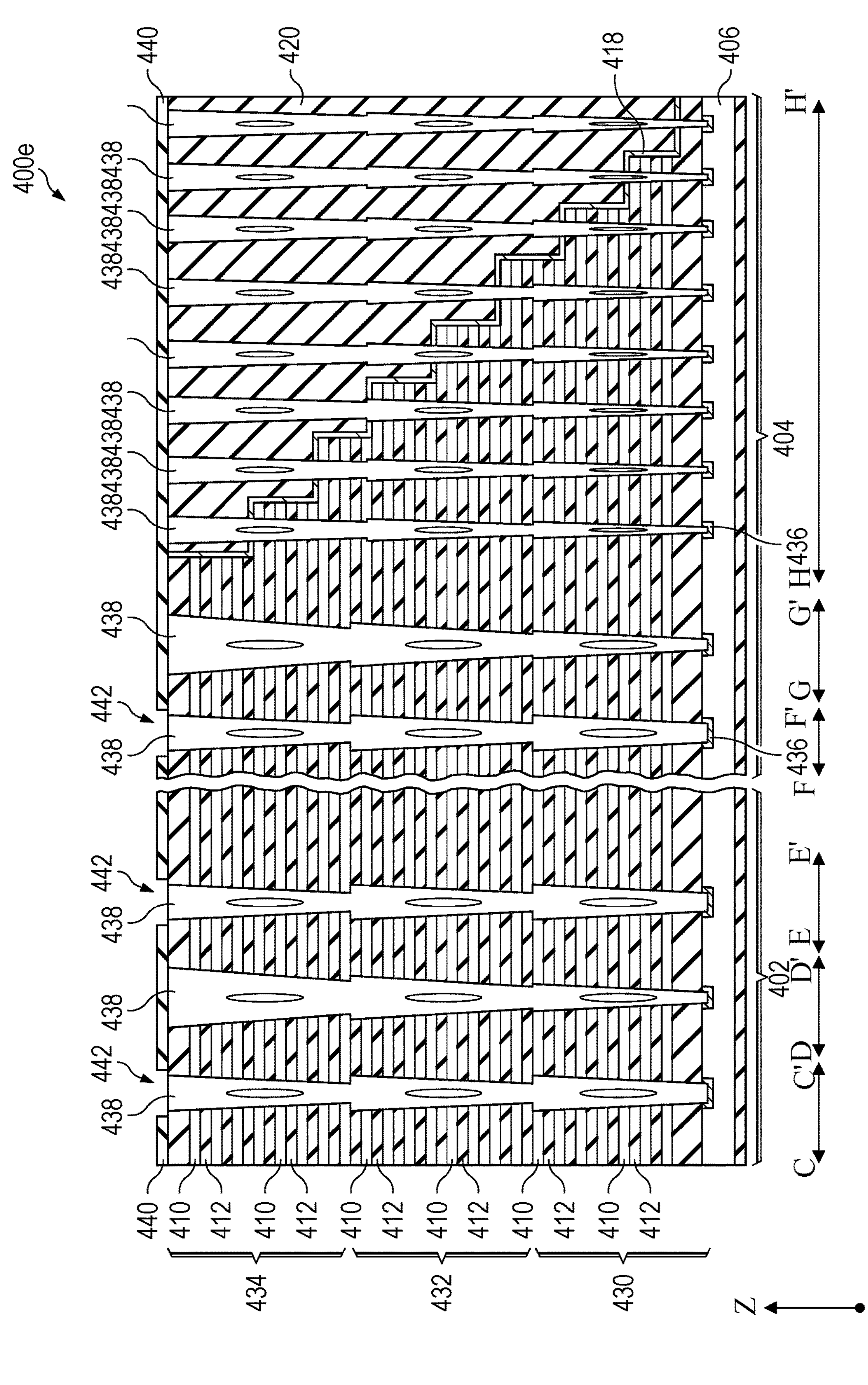
Figure 4F:
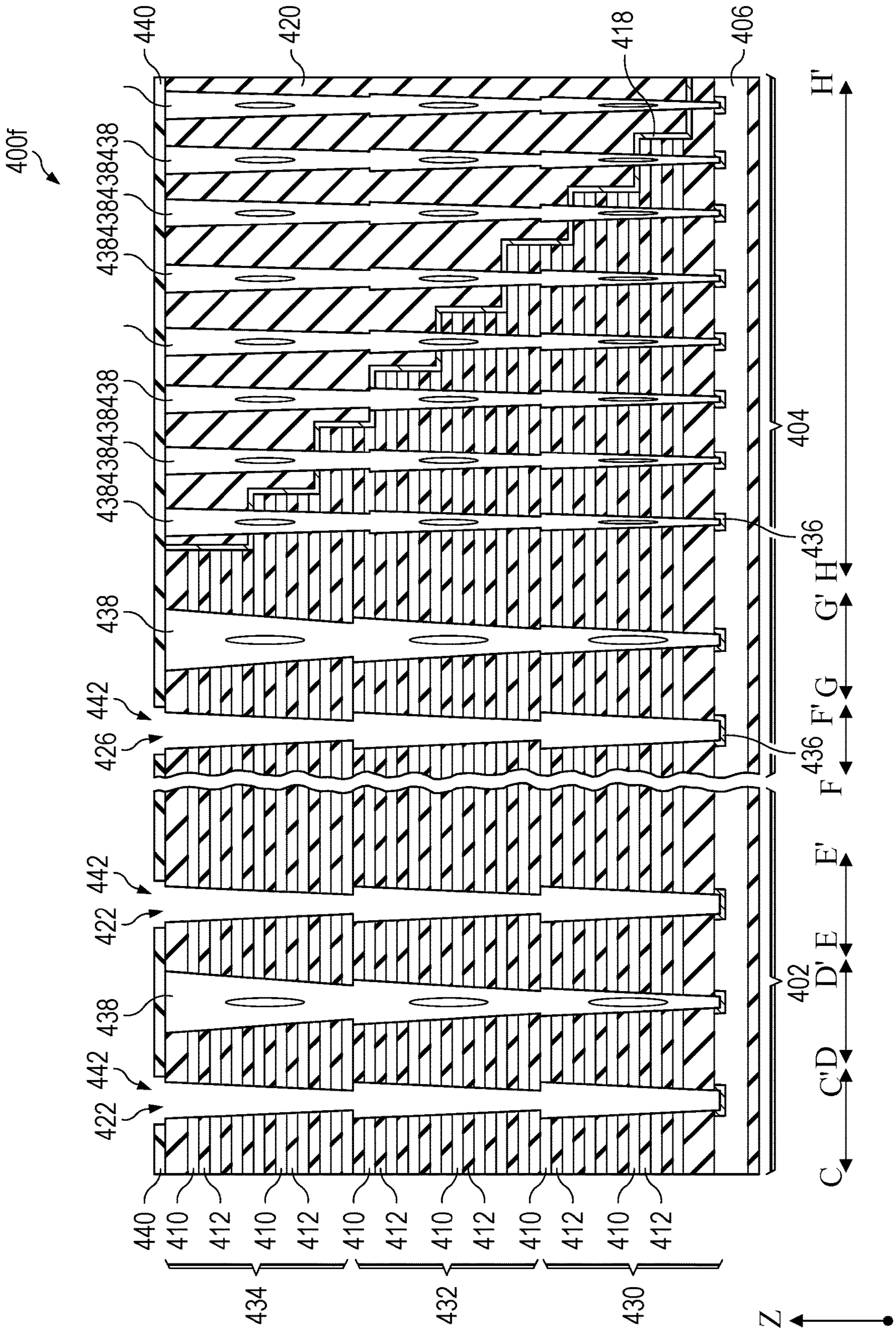
Figure 4G:
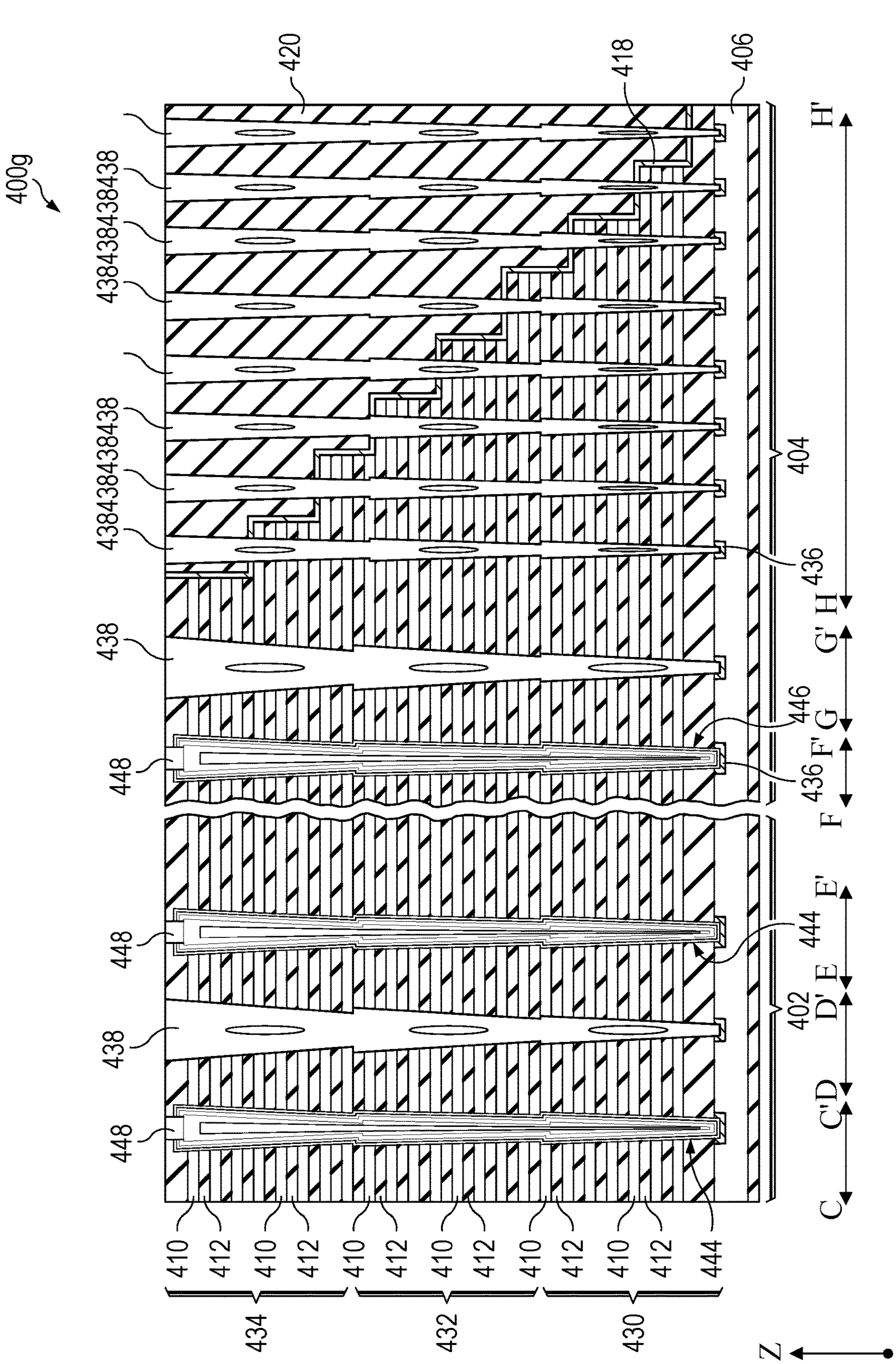
Figure 4H:
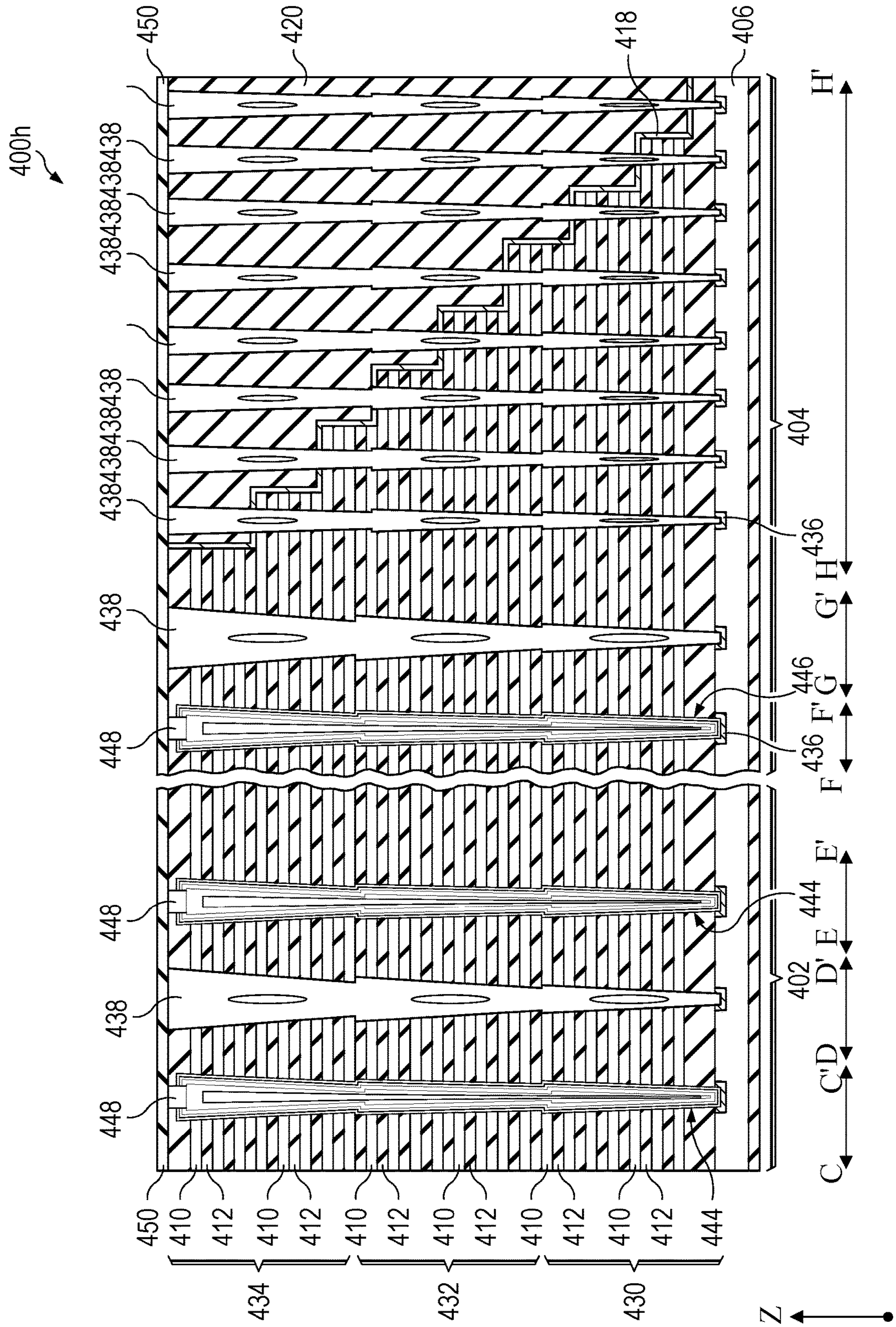
Figure 4I:
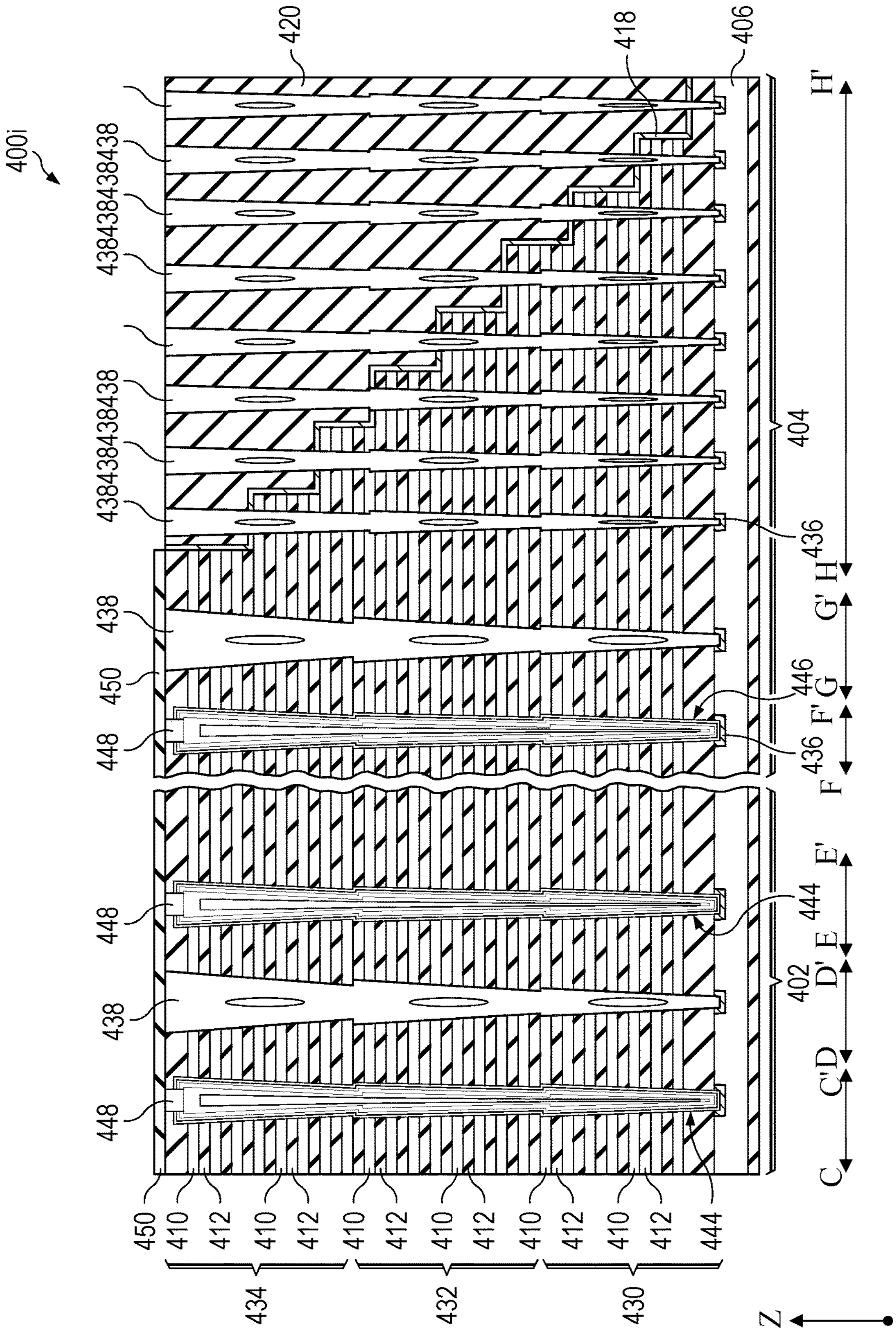
Figure 4J:
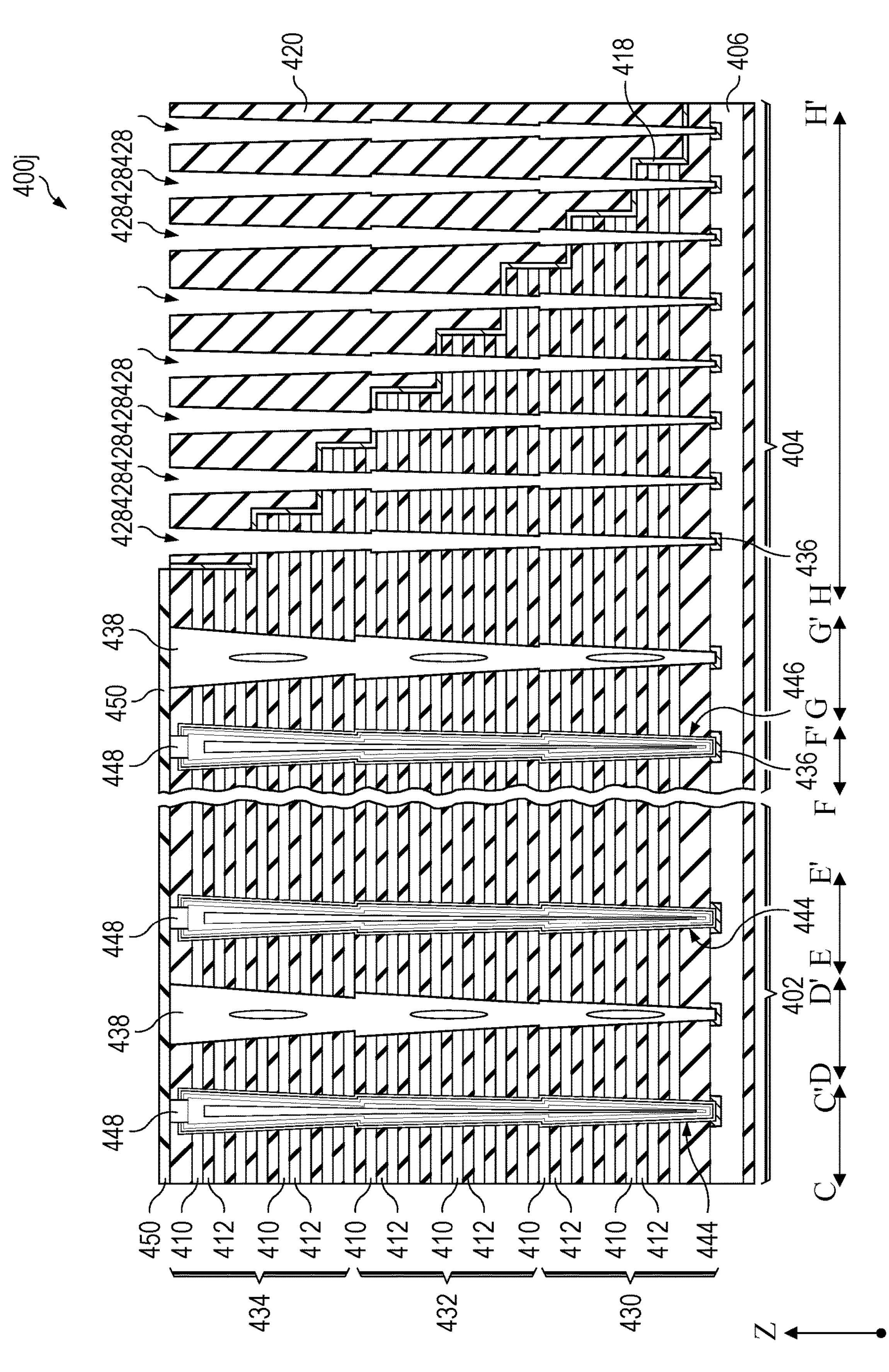
Figure 4K:
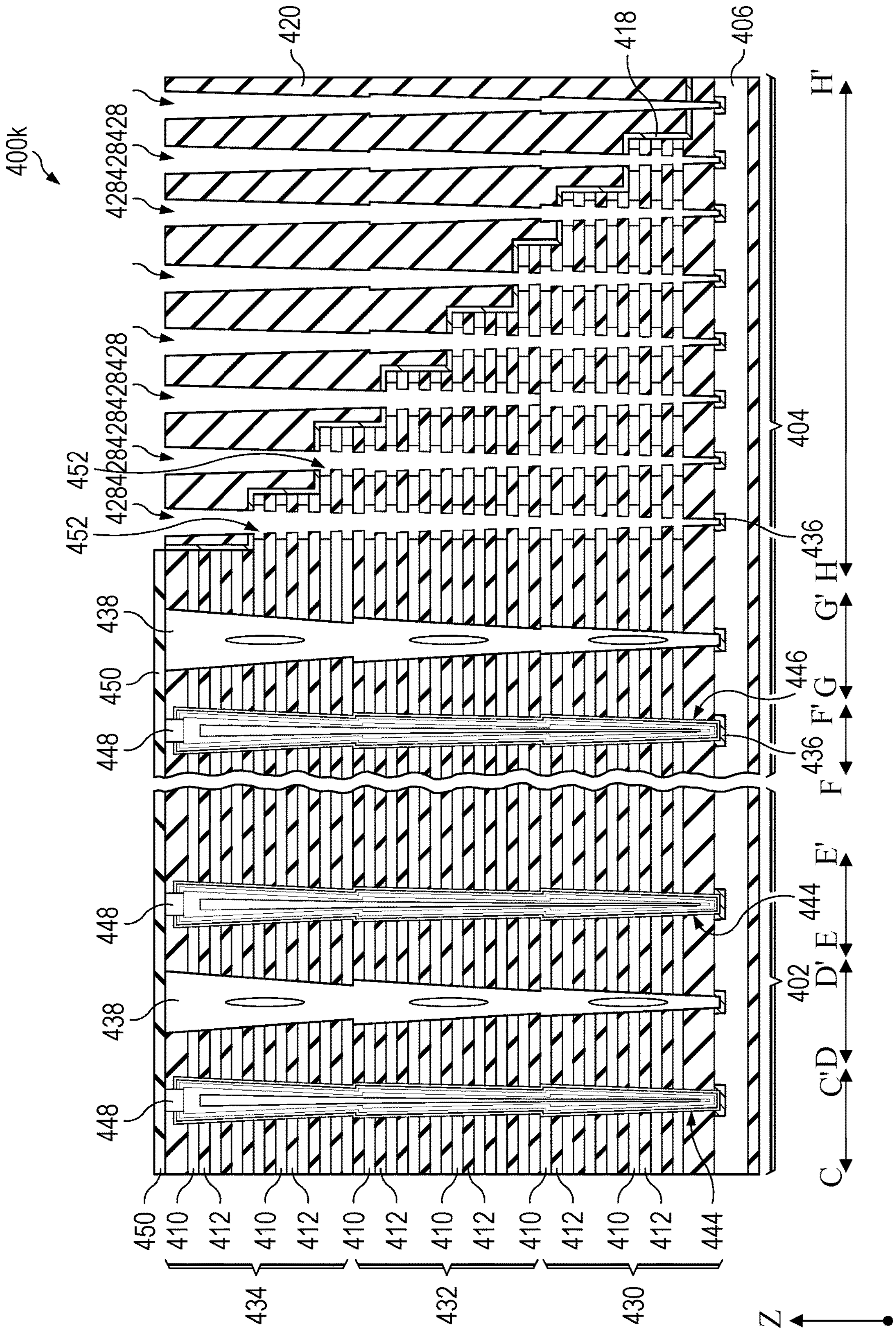
Figure 4L:
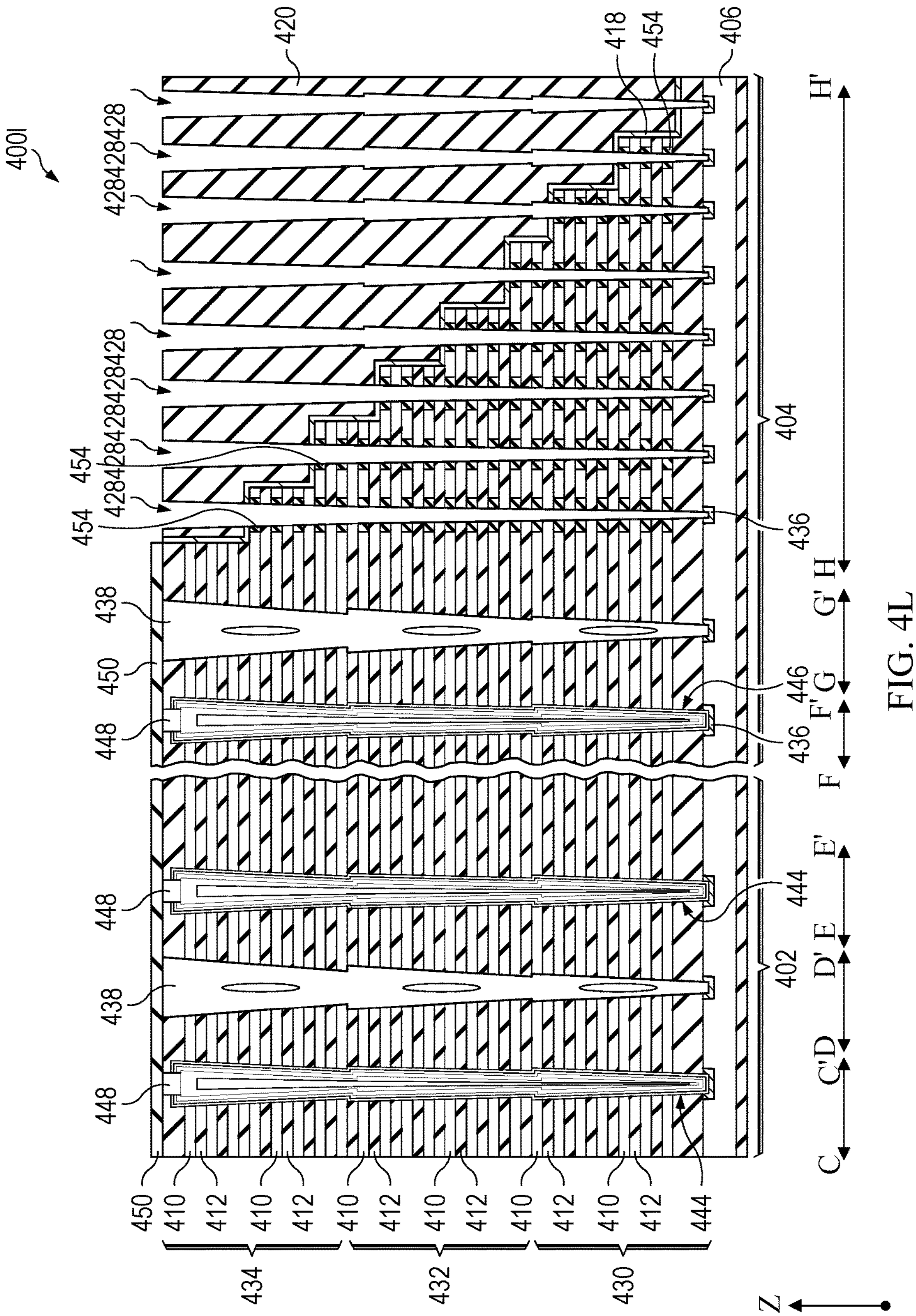
Figure 4M:
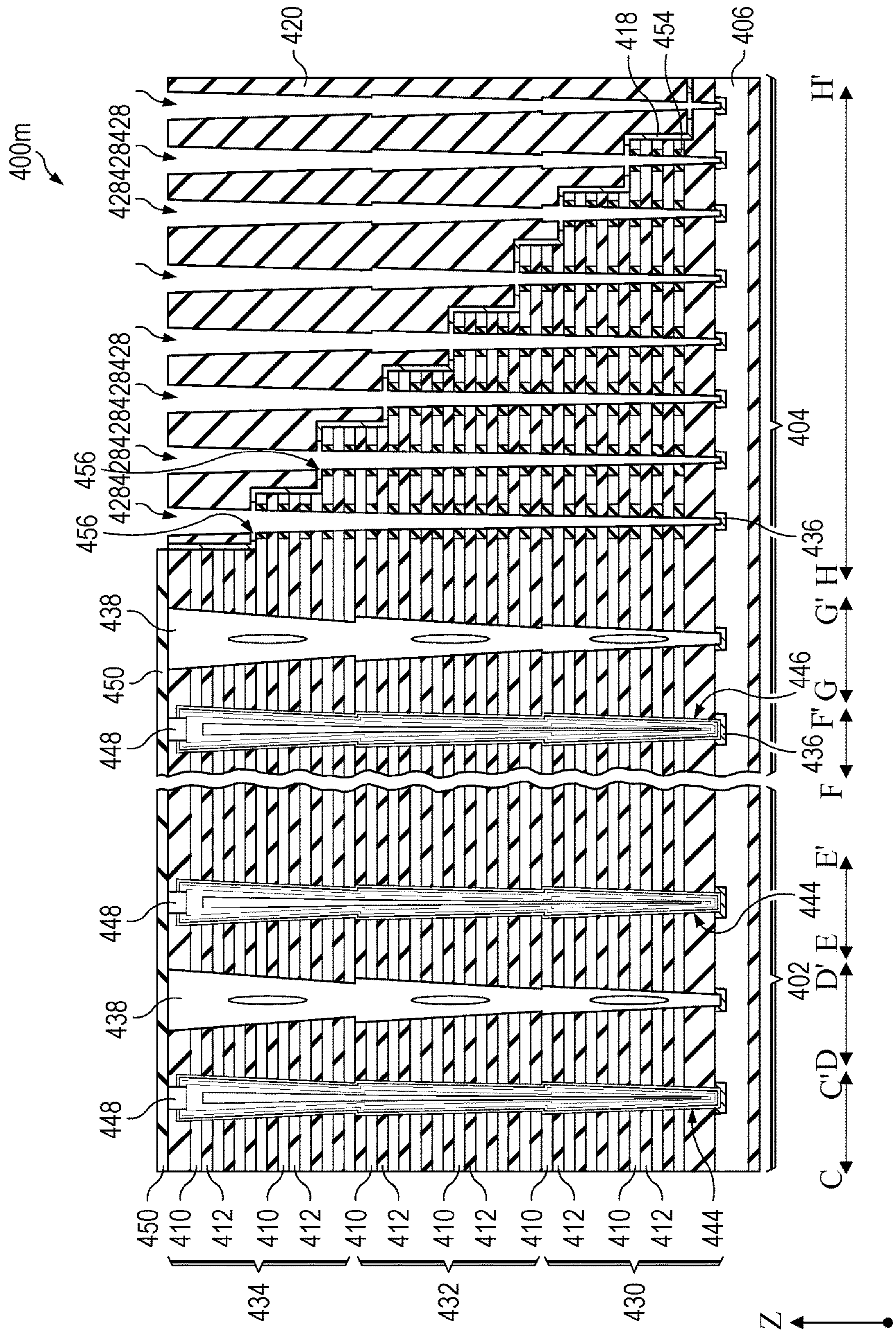
Figure 4N:
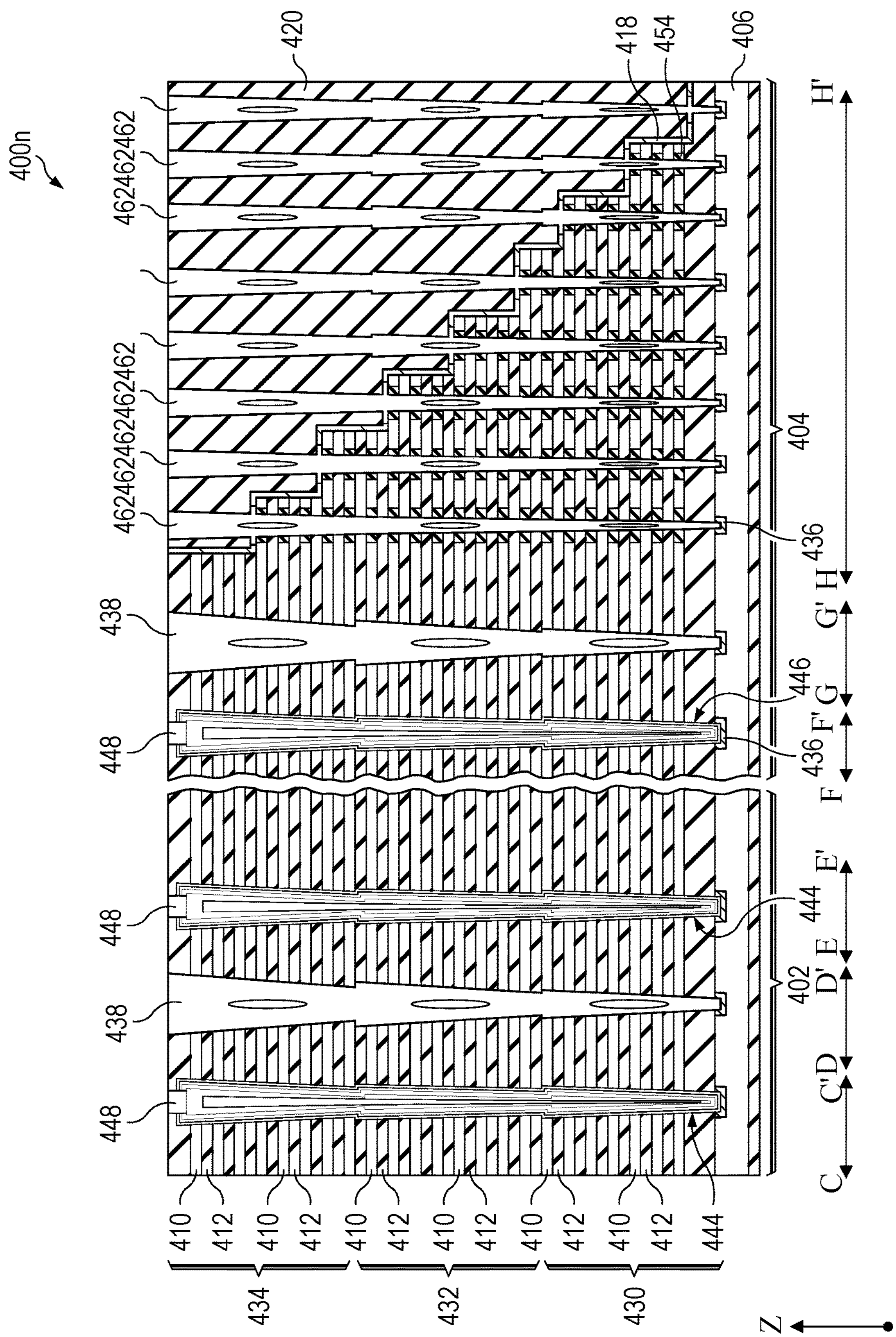
Figure 4O:
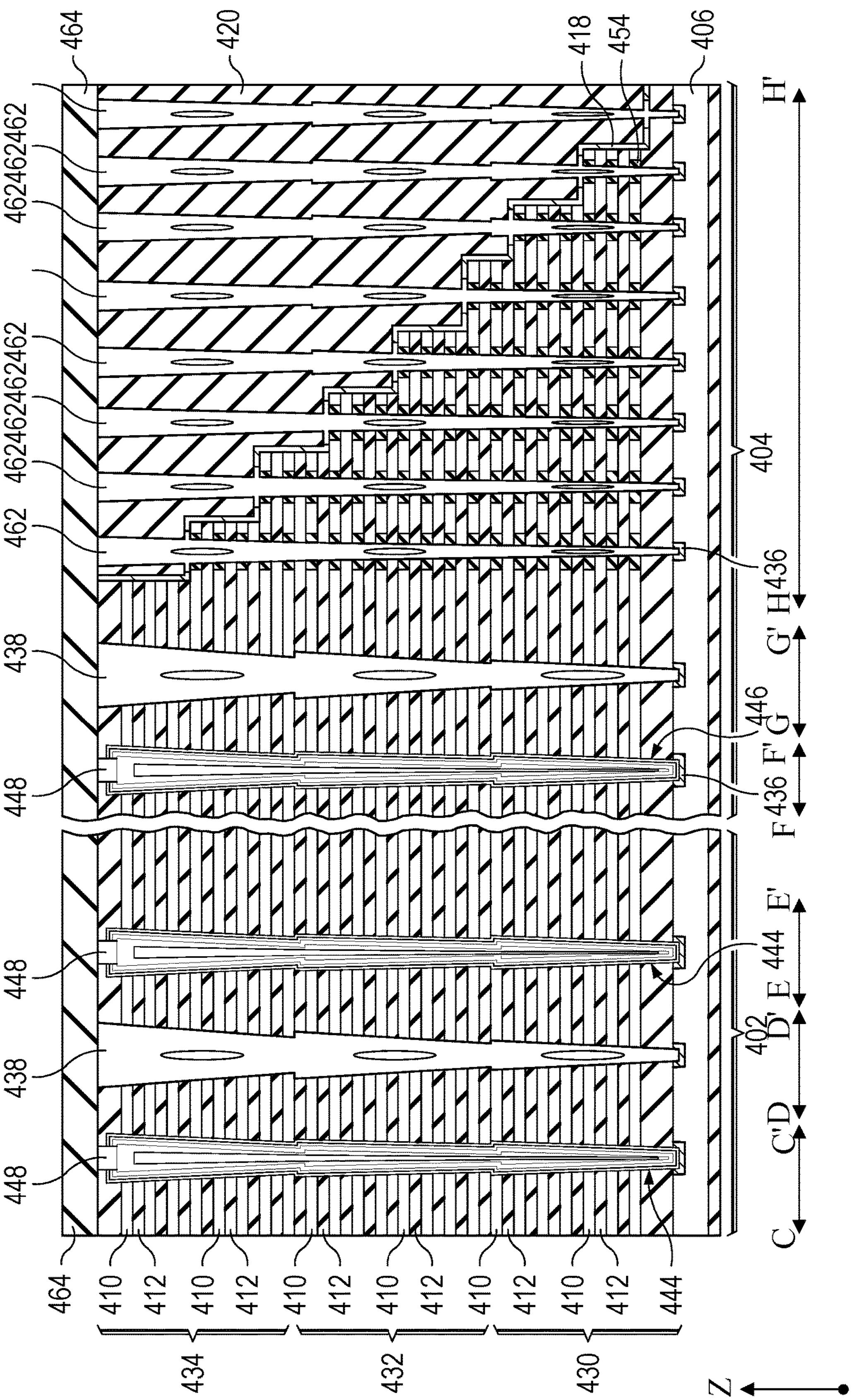
Figure 4P:
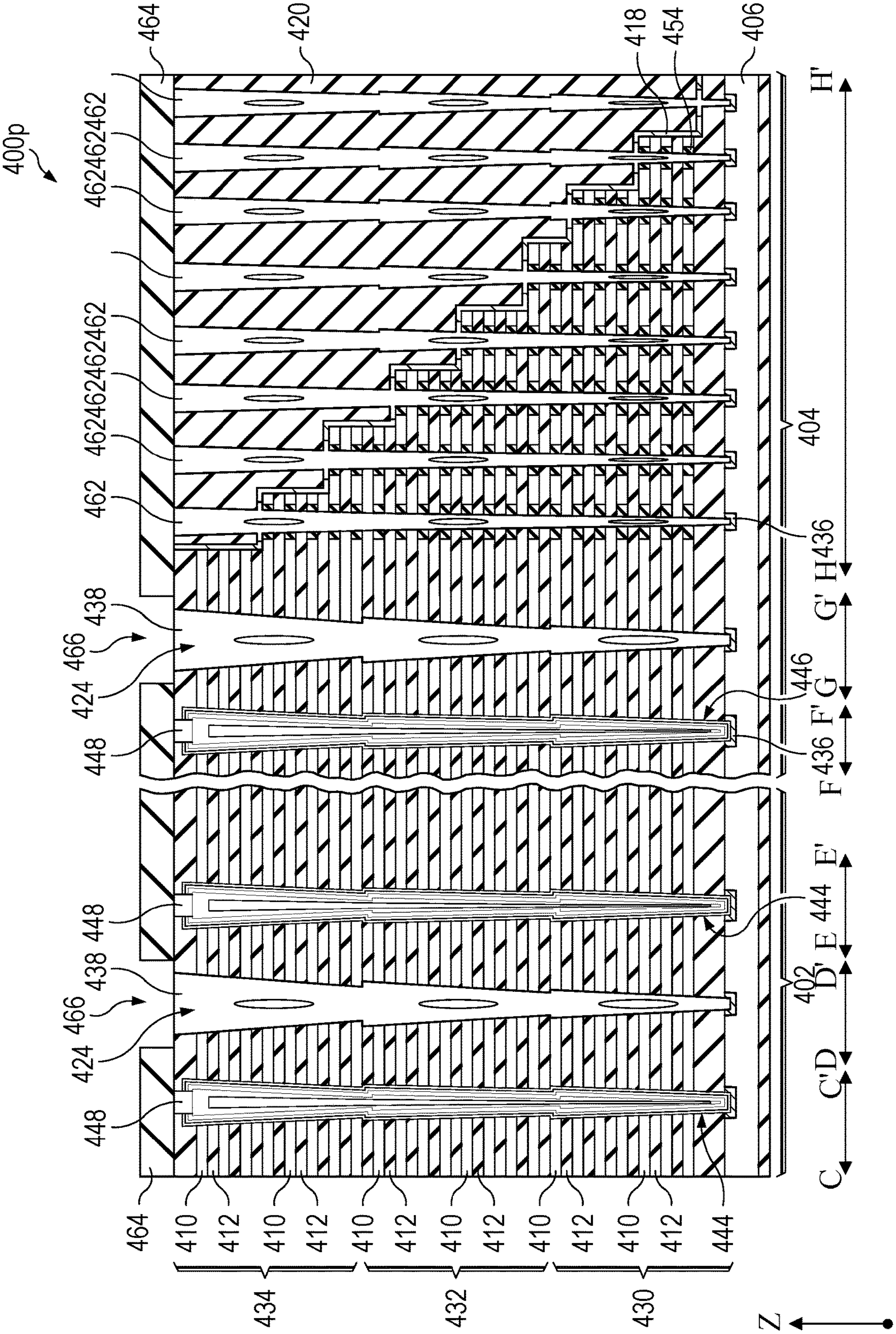
Figure 4Q:
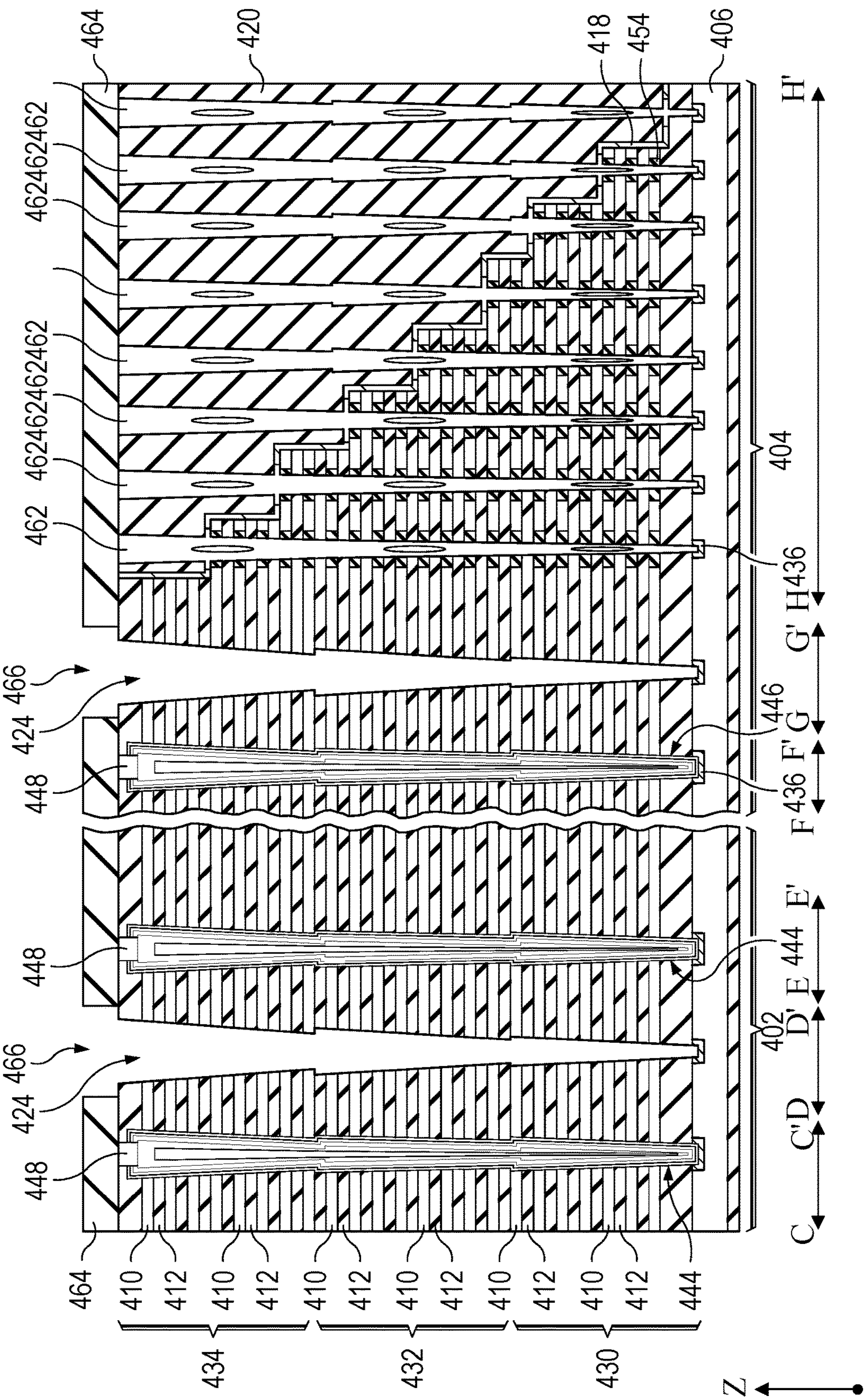
Figure 4R:
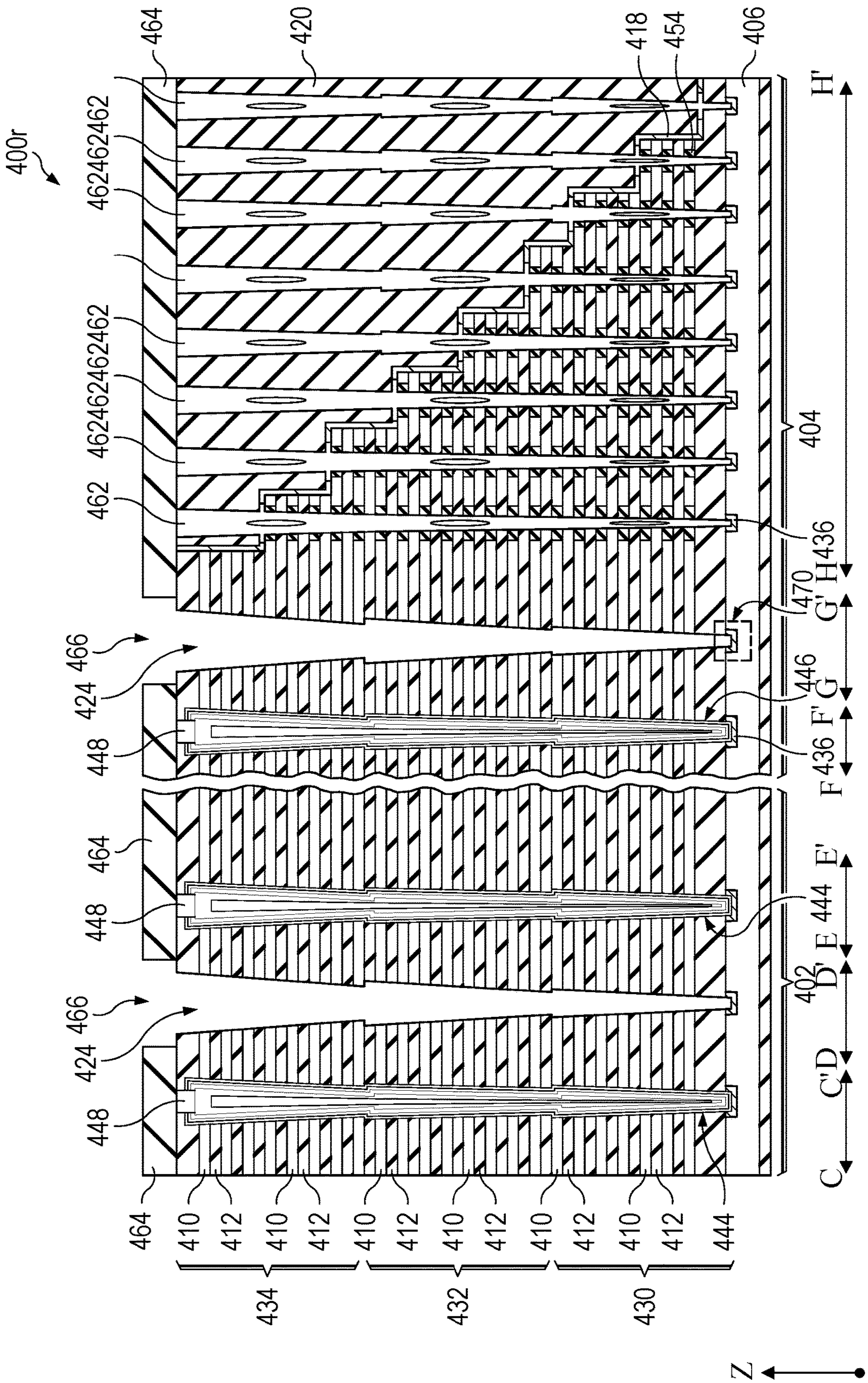
Figure 4S:
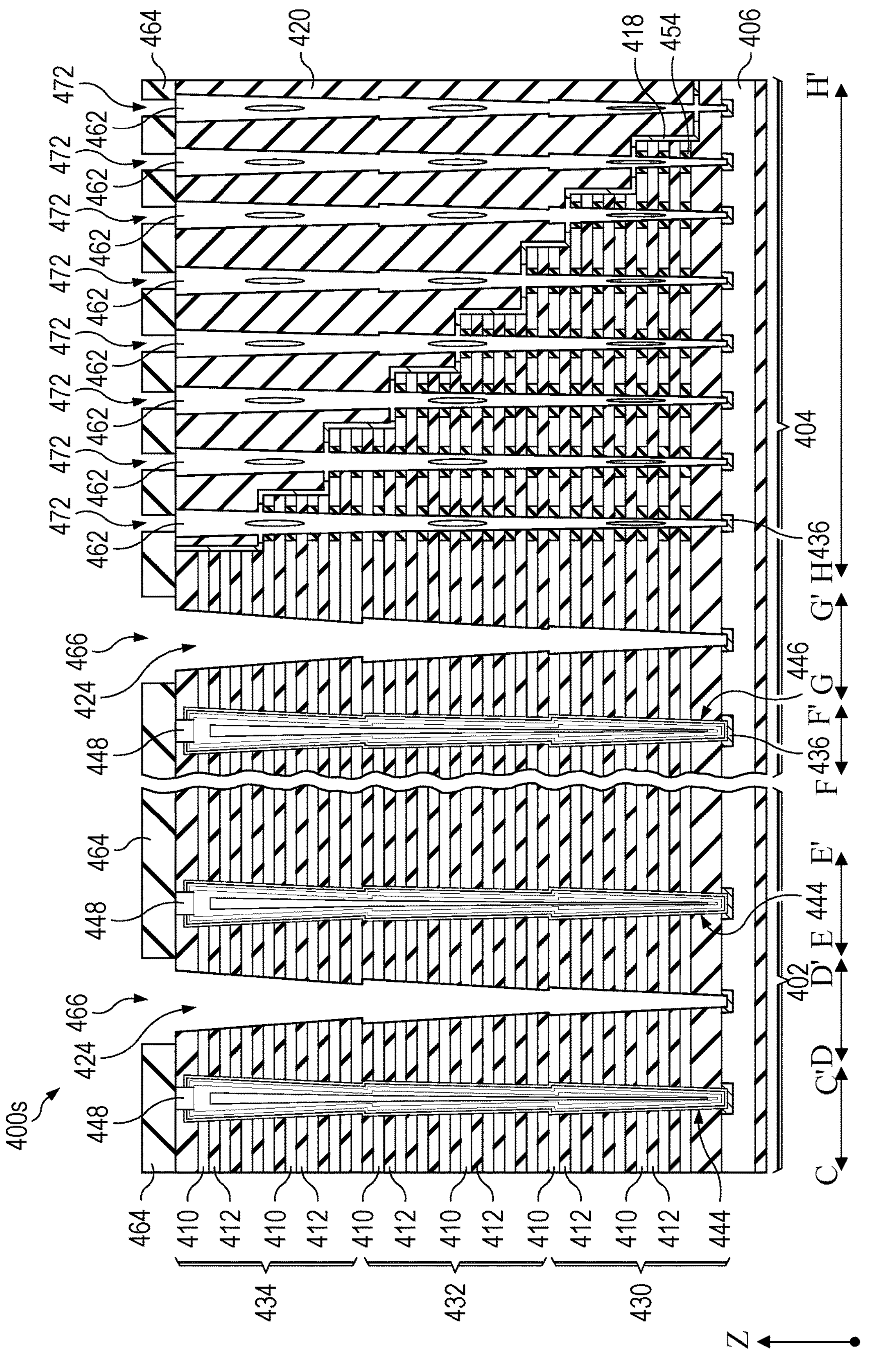
Figure 4T:
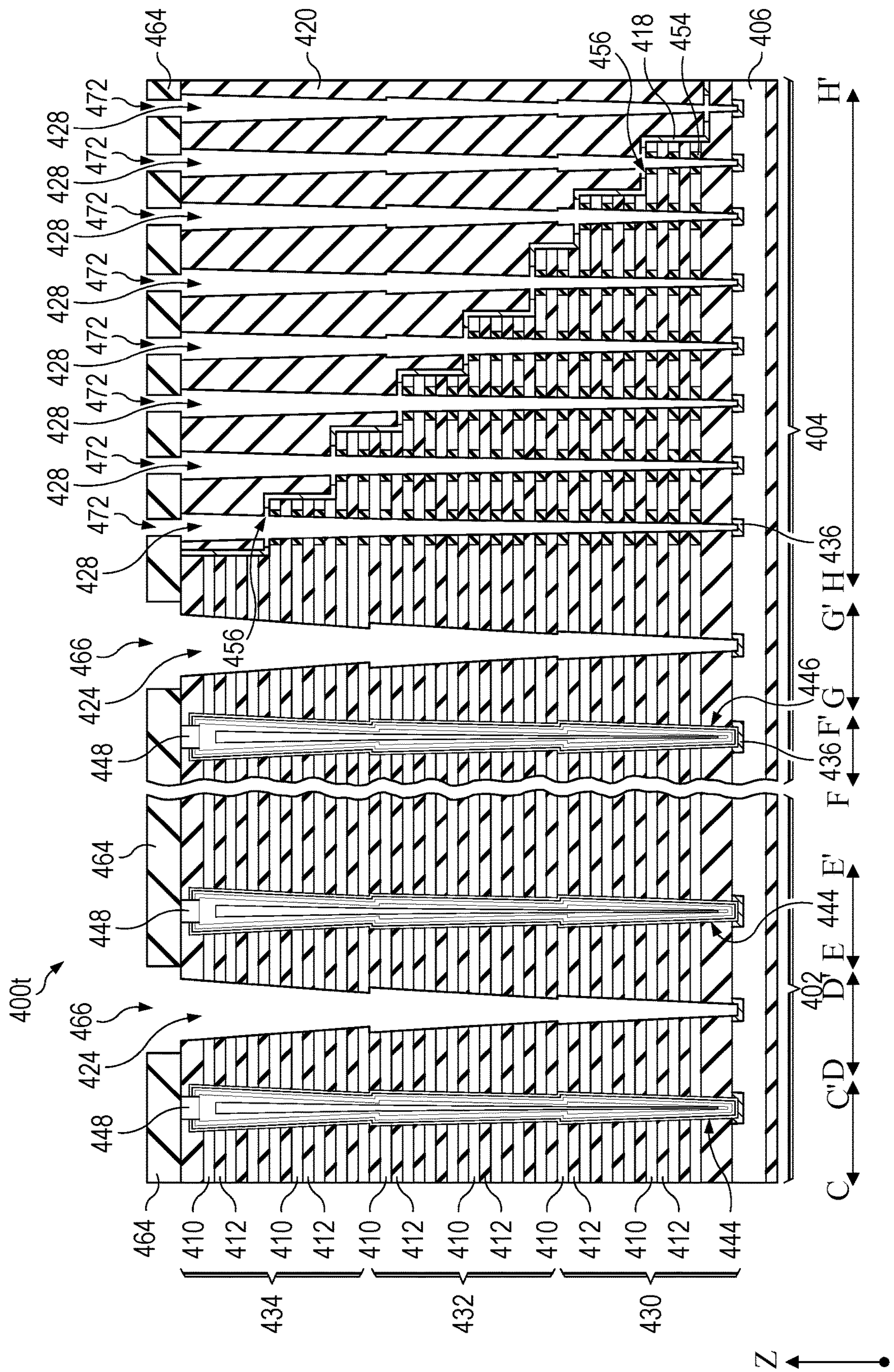
Figure 4U:
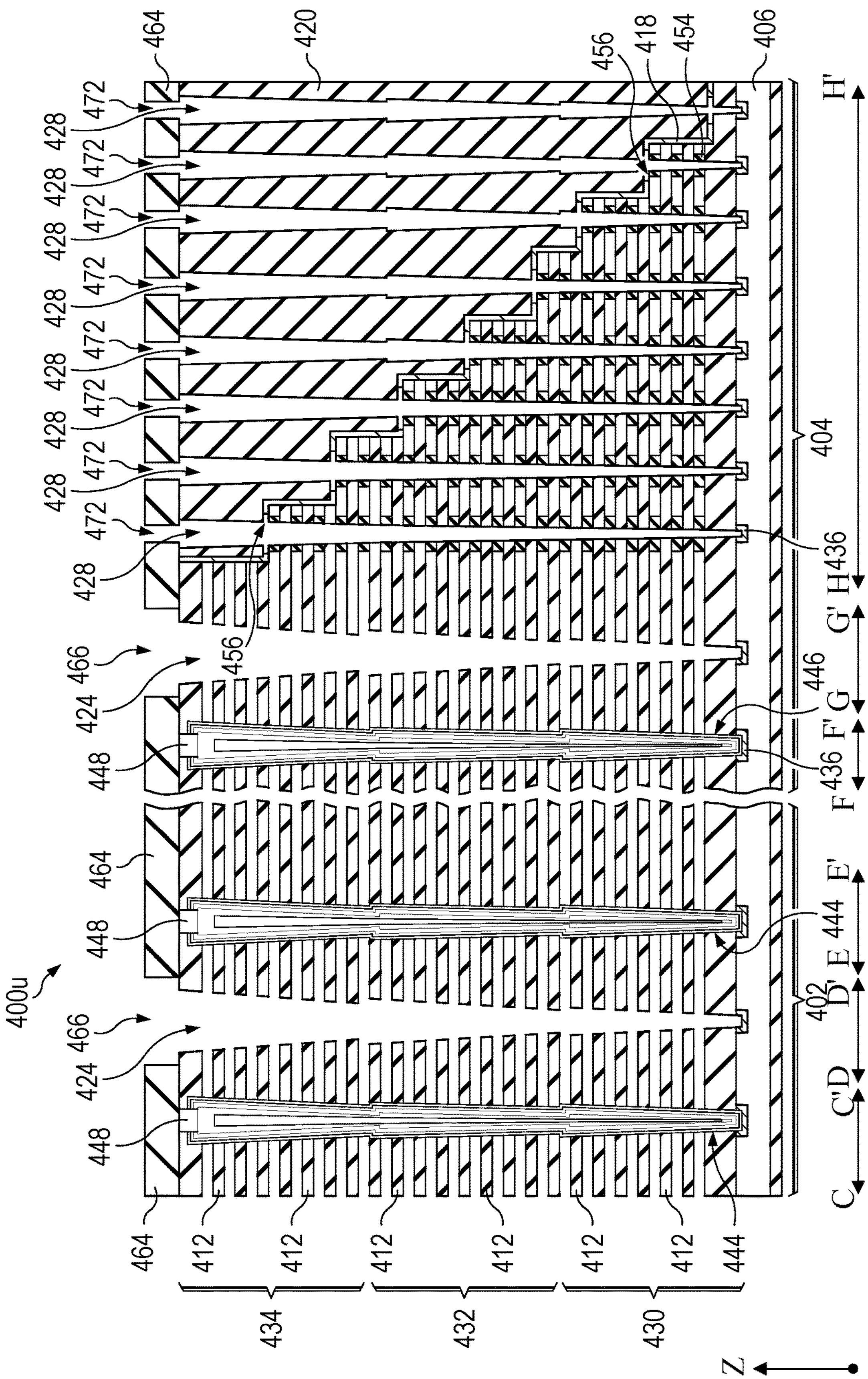
Figure 4V:
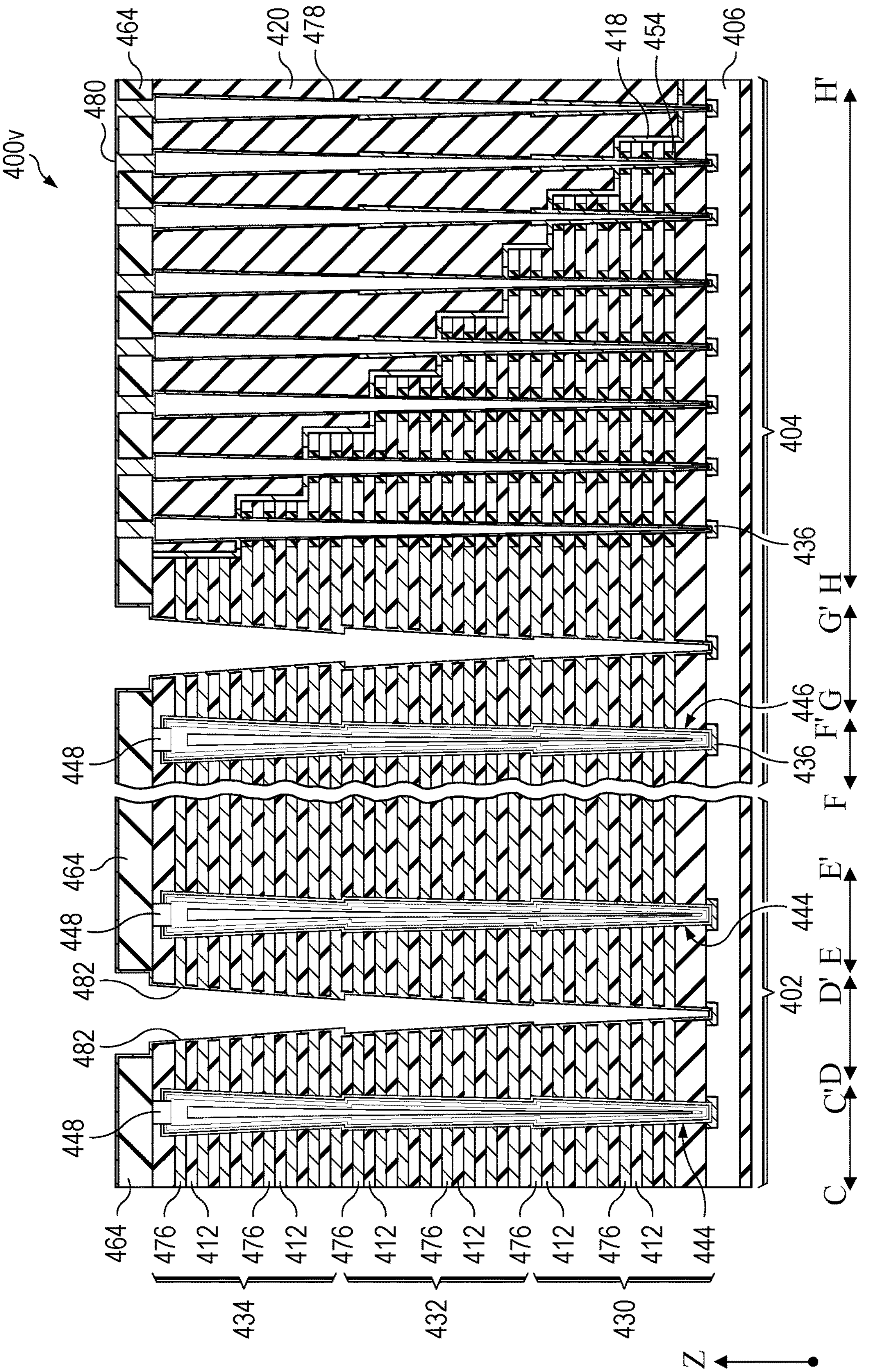
Figure 4W:
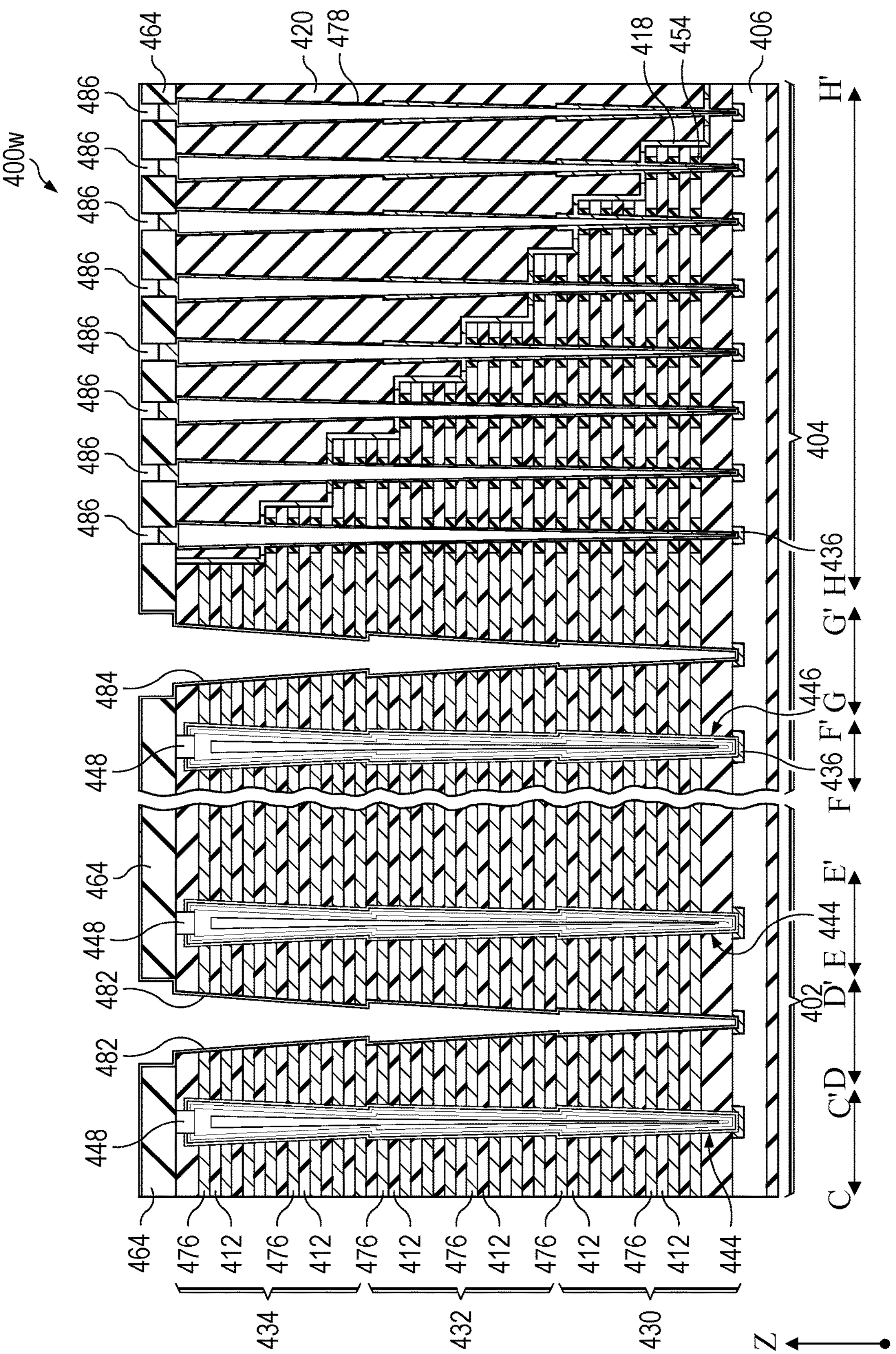

FIGS. 4A-4W illustrate cross-sectional views of example semiconductor structures at various stages of a fabrication process, according to some aspects of the present disclosure. Each of these semiconductor structures can be similar to, or same as, the semiconductor device 100 of FIG. 1A-1B or a structure at an intermediate fabrication process of the semiconductor device 100.

FIG. 4A illustrates a semiconductor structure 400*a*. As shown in FIG. 4A, the semiconductor structure 400*a* includes an array region 402 (in a cross-sectional view along a cut line similar to line AA' of FIG. 1A) and a connection region 404 (in a cross-sectional view along a cut line similar to line BB' of FIG. 1A). The semiconductor structure 400*a* includes a substrate 406 and a stack 408 of alternating sacrificial layers 410 and insulating layers 412 provided over the substrate 406. The substrate 406 can be an example of the substrate 114 of FIG. 1B. The stack 408 can extend in a lateral direction in parallel with a top surface of the substrate 406. The sacrificial layers 410 and the insulating layers 412 can alternate in a vertical direction perpendicular to the lateral direction. The sacrificial layers 410 can be the same or different from each other in thickness, for example, ranging from 10-500 nm, e.g., about 35 nm. The insulating layers 412 can also be the same or different from each other in thickness, for example, ranging from 10-500 nm, e.g., about 25 nm. It should be noted that the number of the sacrificial layers 410 and the insulating layers 412 shown in FIGS. 4A-4W is for illustration only and that any suitable number of the sacrificial layers 410 and the insulating layers 412 can be included in the stack 408. The sacrificial layers 410 can include silicon oxide, silicon nitride, polysilicon, or other suitable materials. The insulating layers 412 can include dielectric materials, such as silicon oxide, silicon nitride, silicon oxynitride, or any combination thereof. In some implementations, the insulating layers 412 can also include high-k dielectric materials, such as hafnium oxide, zirconium oxide, aluminum oxide, tantalum oxide, lanthanum oxide, or any combination thereof. The insulating layers 412 can be an example of the insulating layers 118 of FIG. 1B. In some implementations, the sacrificial layers 410 include silicon nitride and the insulating layers 412 include silicon oxide.

As shown in FIG. 4A, the stack 408 forms a staircase-like structure 414 in the connection region 404. The staircase-like structure 414 can include multiple steps 416. The sacrificial layers 410 and insulating layers 412 of the stack 408 can be deposited over the substrate 406 one by one. The steps 416 of the staircase-like structure 414 can be formed by removing part of the sacrificial layers 410 and insulating layers 412 during an etching process. A topmost layer in each step 416 is a sacrificial layer 410. The semiconductor structure 400*a* further includes a protective layer 418 that is in contact with top and side surfaces of the staircase-like structure 414. The protective layer 418 is in contact with the topmost sacrificial layer 410 in each step 416. The protective layer 418 includes a nitrogen-doped carbide (NDC) material. The NDC material can be a top selective material in an etching process and can have a slower etching rate than other materials such as silicon oxide and silicon nitride. The protective layer 418 can be formed by filling the NDC material in a gap on top of the staircase-like structure 414 and then removing any redundant parts.

FIG. 4B illustrates a semiconductor structure 400*b*. A difference between the semiconductor structure 400*b* and the semiconductor structure 400*a* is that the semiconductor structure 400*b* includes an isolation structure 420 in contact with the protective layer 418. The isolation structure 420 can be an example of the isolation structure 130 of FIG. 1B. The isolation structure 420 can be formed by depositing a dielectric material such as silicon oxide on top of the protective layer 418. The top surface of the semiconductor structure 400*b* can be polished (e.g., using Chemical-mechanical planarization (CMP)). Any part of the protective layer 418 that is not in contact with the staircase-like structure 414 can be removed.

FIG. 4C illustrates a semiconductor structure 400*c*. To better illustrate different components of semiconductor structure 400*c*, FIG. 4C shows a combination of cross-sectional views of semiconductor structure 400*c* along cut lines CC', DD', EE', FF', GG', and HH' (as shown in FIG. 1A). A difference between the semiconductor structure 400*c* and the semiconductor structure 400*b* is that the semiconductor structure 400*c* includes channel holes 422 in the array region 402, gate line holes 424 in both the array region 402 and the connection region 404, channel holes 426 in the connection region 404, and contact holes 428 in the connection region 404. As shown in FIG. 4C, the channel holes 422 and 426, the gate line holes 424, and the contact holes 428 can extend through the stack 408 into the substrate 406 along the Z direction. The channel holes 422 and 426, the gate line holes 424, and the contact holes 428 can be formed by etching using one etching mask (not shown in FIG. 4C) applied on top of the semiconductor structure 400*c*. The mask can have patterns designed for these holes. In some implementations, the semiconductor structure 400*c* has only one deck, and the channel holes 422 and 426, the gate line holes 424, and the contact holes 428 can be formed during one etching process using the mask. In some implementations, the semiconductor structure 400*c* has multiple decks (e.g., 3 decks 430, 432, and 434 as shown in FIG. 4C). In this case, these decks can be formed one by one from the bottom to the top. For example, the deck 430 on the bottom can be formed first as described with respect to FIG. 4B. Then, first segments of the channel holes 422 and 426, the gate line holes 424, and the contact holes 428 can be formed in the deck 430 during a first etching process using the mask. Next, the deck 432 is formed on top of the deck 430, and second segments of the channel holes 422 and 426, the gate line holes 424, and the contact holes 428 can be formed in the deck 432 during a second etching process using the same mask. Last, the deck 434 is formed on top of the deck 432, and third segments of the channel holes 422 and 426, the gate line holes 424, and the contact holes 428 can be formed in the deck 432 during a third etching process using the same mask. It should be noted that the 3 decks shown in FIG. 4C are for illustration only and that any suitable number of decks can be included in the semiconductor structure 400*c*. In some implementations, multiple decks (e.g., decks 430, 432, and 434) can be formed first, and then holes (e.g., channel holes 422 and 426, gate line holes 424, and contact holes 428) that extend through the multiple decks cand be formed in one etching process.

The gate line holes 424 can include one or more series of gate line holes in both the array region 402 and the connection region 404. Each series of gate line holes are arranged in a line along the Y direction and are located next to each other. Sizes and locations of each series of gate line holes are design so that enlarging those gate line holes can connect them and turn them in to a gate line trench extending along the Y direction. Openings and cross sections of the gate line holes 424 can have any suitable shape (e.g., a round shape or an ellipse shape).

In some implementations, as shown in FIG. 4C, protection structures 436 can be formed on bottoms (which are in contact with the substrate 406) of the channel holes 422 and 426, the gate line holes 424, and the contact holes 428 to protect the substrate 406. For example, the protection structures 436 can be formed using polysilicon oxidation.

FIG. 4D illustrates a semiconductor structure 400*d*. A difference between the semiconductor structure 400*d* and the semiconductor structure 400*c* is that the channel holes 422 and 426, the gate line holes 424, and the contact holes 428 of the semiconductor structure 400*d* are filled with a filler material 438 (e.g., polysilicon).

FIG. 4E illustrates a semiconductor structure 400*e*. A difference between the semiconductor structure 400*e* and the semiconductor structure 400*d* is that a silicon oxide layer 440 can be deposited on top of the semiconductor structure 400*c*. Openings 442 can be formed in the silicon oxide layer 440 to expose the filler material 438 in the channel holes 422 and 426. The openings 442 can be formed by an etching process using a mask with patterns that match the channel holes 422 and 426.

FIG. 4F illustrates a semiconductor structure 400*f*. A difference between the semiconductor structure 400*f* and the semiconductor structure 400*e* is that in the semiconductor structure 400*f*, the filler material 438 in channel holes 422 and 426 has been removed (e.g., being etched off using acid).

FIG. 4G illustrates a semiconductor structure 400*g*. A difference between the semiconductor structure 400*g* and the semiconductor structure 400*f* is that the semiconductor structure 400*g* includes channel structures 444 formed in the channel holes 422 and channel structures 446 formed in the channel holes 426. The channel structures 444 can be an example of channel structures 106 of FIGS. 1A-1B, and the channel structure 446 can be an example of the dummy channel structures 108 of FIGS. 1A-1B. Each of the channel structures 444 and 446 can be in the shape of a cylinder or a pillar, and include a high-k layer, a block layer surrounded by the high-k layer, a charge trapping layer (or a storage layer) surrounded by the block layer, a tunneling layer surrounded by the charge trapping layer, a channel layer surrounded by the tunneling layer, and a core filler layer surrounded by the channel layer (not shown), which extend through the stack 408 of sacrificial layers 410 and insulating layers 412. In some implementations, the channel layer can include silicon, such as amorphous silicon, polysilicon, or single crystalline silicon, the tunneling layer can include silicon oxide, silicon nitride, or any combination thereof, the blocking layer can include silicon oxide, silicon nitride, high-k dielectrics, or any combination thereof, and the charge trapping layer can include silicon nitride, silicon oxynitride, silicon, or any combination thereof. In some implementations, the tunneling layer, the charge trapping layer and the blocking layer, collectively referred to as a memory film, can include ONO dielectrics (silicon Oxide-silicon Nitride-silicon Oxide). Each of the channel structures 444 and 446 can be formed by depositing the high-k layer, the block layer, the charge trapping layer, the tunneling layer, the channel layer, and the core filler layer within the channel holes 422 and 426 subsequently. In some implementations, a plug 448 can be formed on top of each of the channel structures 444 and 446. During a later process, the plug 448 can be removed and the channel structures 444 and 446 can be connected to an external component through their top.

FIG. 4H illustrates a semiconductor structure 400*h*. A difference between the semiconductor structure 400*h* and the semiconductor structure 400*g* is that the semiconductor structure 400*h* includes a silicon oxide layer 450 deposited on the top.

FIG. 4I illustrates a semiconductor structure 400*i*. A difference between the semiconductor structure 400*i* and the semiconductor structure 400*h* is that part of the silicon oxide layer 450 in the semiconductor structure 400*i* that is on top of and in contact with the isolation structure 420 can be removed, so that openings of the contact holes 428 and the filler material 438 in the contact holes 428 in the semiconductor structure 400*i* are exposed.

FIG. 4J illustrates a semiconductor structure 400*j*. A difference between the semiconductor structure 400*j* and the semiconductor structure 400*i* is that the filler material 438 in the contact holes 428 of the semiconductor structure 400*j* is removed (e.g., being etched off using acid).

FIG. 4K illustrates a semiconductor structure 400*k*. A difference between the semiconductor structure 400*k* and the semiconductor structure 400*j* is that the semiconductor structure 400*k* includes one or more recesses 452 in each of the sacrificial layers 410 at places where the sacrificial layer 410 is exposed by one or more of the contact holes 428. The recesses 452 can be formed by applying an etchant 458 (not shown) into the contact holes 428. The etchant 458 can have a faster etching rate for the sacrificial layers 410 than the protective layer 418 and the insulating layers 412. In some implementations, sizes of the recesses 452 can be about 20-30 nm in the horizontal direction.

FIG. 4L illustrates a semiconductor structure 400*l*. A difference between the semiconductor structure 400*l* and the semiconductor structure 400*k* is that the semiconductor structure 400*l* includes contact spacer layers 454 each located in one of the contact holes 428. The contact spacer layers 454 are in contact with the sacrificial layers 410 and occupy the recesses 452. The contact spacer layers 454 can include a dielectric material (e.g., silicon oxide).

FIG. 4M illustrates a semiconductor structure 400*m*. A difference between the semiconductor structure 400*m* and the semiconductor structure 400*l* is that the semiconductor structure 400*m* includes recesses 456 in the protective layer 418 at places where the protective layer 418 is exposed by the contact holes 428. The recesses 456 are deeper than the recesses 452 in the horizontal direction. This way, the sacrificial layers 410 that are in contact with the protective layer 418 in the vertical direction can be exposed by the recesses 456. The recesses 456 can be formed by applying an etchant 460 (not shown) into the contact holes 428. The etchant 460 can be different from the etchant 458 described with respect to FIG. 4K and can have a faster etching rate for the protective layer 418 than the contact spacer layers 454 and the insulating layers 412.

FIG. 4N illustrates a semiconductor structure 400*n*. A difference between the semiconductor structure 400*n* and the semiconductor structure 400*m* is that the contact holes 428 and the recesses 456 of the semiconductor structure 400*n* are filled with a sacrificial material 462 (e.g., carbon). A top surface of the semiconductor structure 400*n* can be polished (e.g., using CMP) so that a remaining part of the silicon oxide layer 450 can be removed.

FIG. 4O illustrates a semiconductor structure 4000. A difference between the semiconductor structure 4000 and the semiconductor structure 400*n* is that the semiconductor structure 4000 includes an isolating layer 464 deposited on the top. In some implementations, a depth of the isolating layer 464 can be about 100 nm. The isolating layer 464 can include a dielectric material (e.g., silicon oxide).

FIG. 4P illustrates a semiconductor structure 400*p*. A difference between the semiconductor structure 400*p* and the semiconductor structure 4000 is that the isolating layer 464 of the semiconductor structure 400*p* includes openings 466 that expose the filler material 438 in the gate line holes 424.

FIG. 4Q illustrates a semiconductor structure 400*q*. A difference between the semiconductor structure 400*q* and the semiconductor structure 400*p* is that the filler material 438 in the gate line holes 424 of the semiconductor structure 400*q* is removed. In addition, the gate line holes 424 of the semiconductor structure 400*q* are enlarged (e.g., being etched and enlarged using acid) so that the enlarged the gate line holes 424 are connected along the Y direction. As a result, one or more gate line trenches 468 (not shown in FIG. 4Q) extending along the Y direction can be formed. In some implementations, removing the filler material 438 in the gate line holes 424 and enlarging the gate line holes 424 may expose the substrate 406 that is in contact with bottoms of the gate line holes 424 or the gate line trenches 468. It should be noted that FIG. 4Q is only for illustration purposes, and that widths of the enlarged gate line holes 424 in FIG. 4Q should be larger than those as shown in other figures before the enlargement (e.g., FIG. 4P).

FIG. 4R illustrates a semiconductor structure 400*r*. A difference between the semiconductor structure 400*r* and the semiconductor structure 400*q* is that protection structures 470 are formed on the bottoms of the gate line trenches 468 in the semiconductor structure 400*r* to protect the substrate 406. For example, the protection structures 470 can be formed using polysilicon oxidation. The protection structures 470 can protect the substrate 406 from being etched off in a later process (e.g., when the sacrificial layers 410 are etched off).

FIG. 4S illustrates a semiconductor structure 400*s*. A difference between the semiconductor structure 400*s* and the semiconductor structure 400*r* is that the isolating layer 464 of the semiconductor structure 400*s* includes contact openings 472 that extend through the isolating layer 464 in the Z direction and expose the sacrificial material 462 (e.g., carbon) in the contact holes 428. Each contact openings 472 is located on top of a respective contact hole 428. The contact opening 472 can be shaped like a cylinder or a truncated cone. The contact opening 472 is narrower than the contact hole 428. Specifically, the bottom of the contact opening 472 is smaller than an opening at the top of the contact hole 428. A width of the contact opening 472 can be, for example, about 40-50 nm.

FIG. 4T illustrates a semiconductor structure 400*t*. A difference between the semiconductor structure 400*t* and the semiconductor structure 400*s* is that the sacrificial material 462 in the contact holes 428 and the recesses 456 of the semiconductor structure 400*t* is removed. In some implementations, the sacrificial material 462 includes carbon and can be burnt off.

FIG. 4U illustrates a semiconductor structure 400*u*. A difference between the semiconductor structure 400*u* and the semiconductor structure 400*t* is that the sacrificial layers 410 of the semiconductor structure 400*u* are removed. The sacrificial layers 410 can be removed by filling an etchant 474 (not shown) into the contact holes 428 and the gate line trenches 468. The etchant 474 can have a faster etching rate for the sacrificial layers 410 than the insulating layers 412, the protective layer 418, and the contact spacer layers 454.

FIG. 4V illustrates a semiconductor structure 400*v*. A difference between the semiconductor structure 400*v* and the semiconductor structure 400*u* is that the semiconductor structure 400*v* includes conductive layers 476 and contact structures 478. The conductive layers 476 and the contact structures 478 can be formed by filling at least one conductive material (e.g., tungsten) into the gate line trenches 468 and the contact holes 428. In some implementations, the conductive layers 476 and the contact structures 478 each includes multiple layers (e.g., an outer layer including a high-k dielectric material, an intermediate layer including a titanium nitride material, and an inner layer including tungsten). Thus, the conductive layers 476 and the contact structures 478 can be formed in multiple steps. For example, the first step includes depositing the high-k dielectric material to form the outer layer; the second step includes depositing the titanium nitride material to form the intermediate layer; and the third step includes depositing the tungsten to form the inner layer. In some implementations, the at least one conductive material can be filled into the gate line trenches 468 and the contact holes 428 during a conformal deposition process.

Due to the size differences between the contact holes 428 and the contact openings 472, each of the contact holes 428 may not be fully filled. Thus, each of the contact structures 478 may have a hollow region in its interior. On the other hand, the contact openings 472 can be fully filled, which closes the contact structures 478 from the top. The conductive material can be left on a top surface 480 of the semiconductor structure 400*v* and on inner surfaces 482 of the gate line trenches 468.

FIG. 4W illustrates a semiconductor structure 400*w*. A difference between the semiconductor structure 400*w* and the semiconductor structure 400*v* is that the conductive material on the inner surfaces 482 of the gate line trenches 468 and the top surface 480 of the semiconductor structure 400*v* is removed (e.g., being etched off). This etching process can expose the conductive layers 476 in the gate line trenches 468 and create recesses 484 on the inner surfaces 482 of the gate line trenches 468. Thus, the conductive layers 476 are separated from each other. This etching process can also remove the conductive material in an upper part of each contact opening 472 and create recesses 486. A lower part of each contact opening 472 is still filled, which can form a head of the contact structure 478. This way, the contact structures 478 also are separated from each other. In some implementations, a spacer layer can be filled in the recesses 484 and 486.

The conductive layers 476 formed in the semiconductor structure 400*w* can be an example of the conductive layers 116 of FIG. 1B. The contact structures 478 formed in the semiconductor structure 400*w* can be an example of the contact structures 110 of FIGS. 1B, 2, and 3.

Figure 5A:
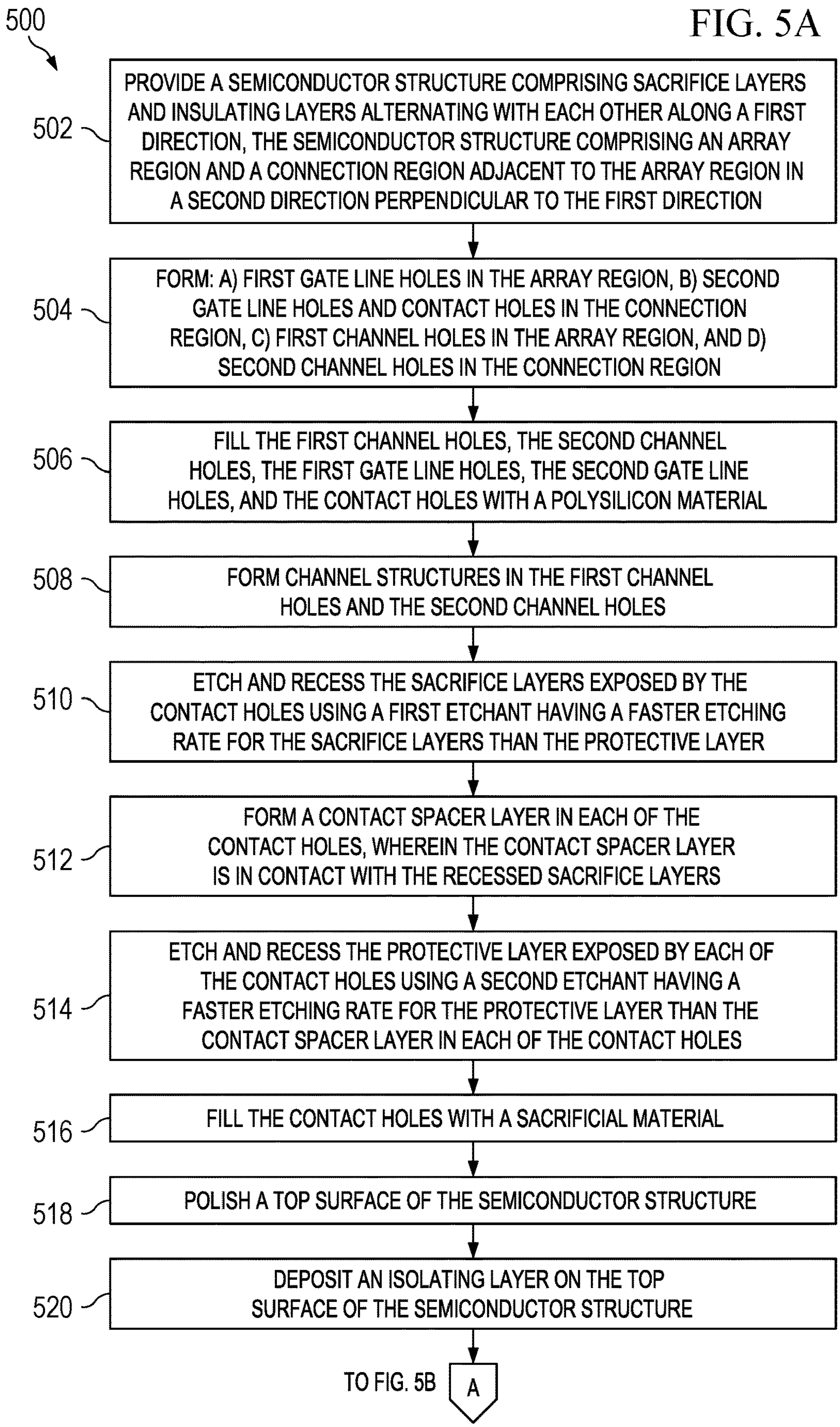
FIGS. 5A-5B illustrate a flow chart of an example process of forming a semiconductor device, according to some aspects of the present disclosure.
Figure 5B:
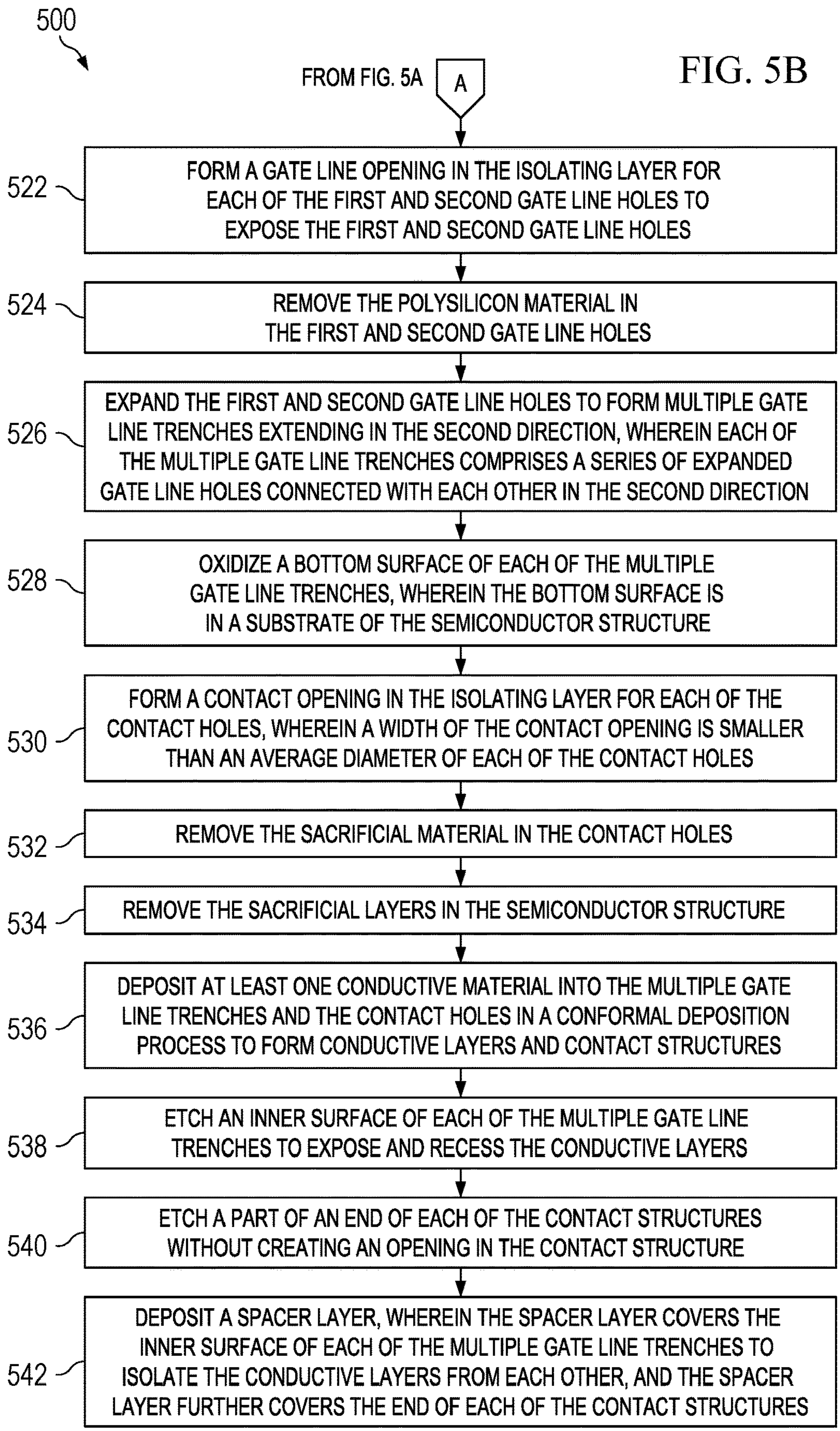

FIGS. 5A-5B illustrate a flow chart of an example process 500 of forming a semiconductor device, according to some aspects of the present disclosure. The semiconductor device can be similar to, or same as, the semiconductor device 100 of FIG. 1A-1B, or a part of the semiconductor device 100, or a structure at an intermediate fabrication process of the semiconductor device 100. The process 500 can be described in view of FIGS. 4A-4W. The process 500 can include the fabrication process of forming the semiconductor structures in FIGS. 4A-4W. The process 500 includes steps that can be performed with any suitable order and/or any combination.

At step 502, a semiconductor structure including sacrificial layers and insulating layers alternating with each other along a first direction (e.g., the Z direction) is provided. The semiconductor structure can be similar to, or same as, the semiconductor structures 400*b* of FIG. 4B. The semiconductor structure includes an array region and a connection region adjacent to the array region in a second direction (e.g., the Y direction) perpendicular to the first direction. The array region can be the array region 402 of FIG. 4B, and the connection region can be the connection region 404 of FIG. 4B. The sacrificial layers can be the sacrificial layers 410 of FIGS. 4A-4B. The insulating layers can be the insulating layers 412 of FIGS. 4A-4B. In some implementations, each of the sacrificial layers includes silicon nitride, and each of the insulating layers includes silicon oxide.

The semiconductor structure can include one or more decks sequentially stacked in the first direction. Each deck of the one or more decks can include a subset of the sacrificial layers and the insulating layers. The one or more decks can be the decks 134, 136, and 138 of FIG. 1B.

In some implementations, the connection region includes an isolation structure, and a protective layer is formed between the isolation structure and the sacrificial layers. The isolation structure can be the isolation structure 420 of FIG. 4B. the protective layer can be the protective layer 418 of FIG. 4B. The isolation structure can have a staircase-like shape. In some implementations, the isolation structure includes silicon oxide, and the protective layer includes a NDC material.

At step 504, first gate line holes, second gate line holes, contact holes, first channel holes, and second channel holes are formed. The first gate line holes are formed in the array region. The second gate line holes and the contact holes are formed in the connection region. The first gate line holes can be the gate line holes 424 in the array region 402 of FIG. 4C. The second gate line holes can be the gate line holes 424 in the connection region 404 of FIG. 4C. In some implementations, each gate line hole of the first gate line holes and the second gate line holes has a cross section of a round shape or an ellipse shape. The first channel holes can be the channel holes 422 of FIG. 4C. The first channel holes are formed in the array region. The second channel holes can be the channel holes 426 of FIG. 4C. The second channel holes are formed in the connection region. The first gate line holes, the second gate line holes, the contact holes, the first channel holes, and the second channel holes extend through the semiconductor structure along the first direction.

The first gate line holes, the second gate line holes, the contact holes, the first channel holes, and the second channel holes in each deck of the one or more decks are formed during a same etching process. In some implementations, the first gate line holes, the second gate line holes, the first channel holes, the second channel holes, and the contact holes are formed using a single etching mask.

The contact holes can be the contact holes 428 of FIG. 4C. In some implementations, the contact holes in each deck of the one or more decks includes truncated cones that taper along the first direction.

At step 506, the first channel holes, the second channel holes, the first gate line holes, the second gate line holes, and the contact holes are filled with a polysilicon material.

At step 508, channel structures are formed in the first channel holes and the second channel holes. The channel structures can be the channel structures 444 and 446 of FIG. 4G.

At step 510, the sacrificial layers exposed by the contact holes are etched and recessed using a first etchant. The first etchant can be the etchant 458 described with respect to FIG. 4K. The first etchant has a faster etching rate for the sacrificial layers than the protective layer.

At step 512, a contact spacer layer is formed in each of the contact holes. The contact spacer layer can be one of the contact spacer layers 454 of FIG. 4L. The contact spacer layer is in contact with the recessed sacrificial layers. In some implementations, the contact spacer layer includes silicon oxide.

At step 514, the protective layer exposed by each of the contact holes is etched and recessed using a second etchant. The second etchant can be the etchant 460 described with respect to FIG. 4M. The second etchant can have a faster etching rate for the protective layer than the contact spacer layer in each of the contact holes.

At step 516, the contact holes are filled with a sacrificial material. The sacrificial material can be the sacrificial material 462 of FIG. 4N. In some implementations, the sacrificial material can include carbon.

At step 518, a top surface of the semiconductor structure is polished.

At step 520, an isolating layer is deposited on the top surface of the semiconductor structure. The isolating layer can be the isolating layer 464 of FIG. 4O. In some implementations, the isolating layer can include silicon oxide. In some implementations, a depth of the isolating layer is about 100 nm.

At step 522, a gate line opening for each of the first and second gate line holes is formed in the isolating layer to expose the first and second gate line holes. The gate line opening can be one of the gate line openings 466 of FIG. 4P.

At step 524, the polysilicon material in the first and second gate line holes is removed.

At step 526, the first and second gate line holes are expanded to form multiple gate line trenches extending in the second direction. The multiple gate line trenches can be similar to, or same as, the gate line slits 112 of FIGS. 1A-1B. The multiple gate line trenches can also be the gate line trenches 468 described with respect to FIG. 4Q. Each of the multiple gate line trenches includes a series of expanded gate line holes connected with each other along the second direction.

At step 528, a bottom surface of each of the multiple gate line trenches is oxidized. The bottom surface is in a substrate (e.g., the substrate 406 of FIG. 4A) of the semiconductor structure. As a result, protection structures (e.g., the protection structures 470 of FIG. 4R) are formed on the bottom surfaces of the multiple gate line trenches to protect the substrate of the semiconductor structure. In some implementations, the protection structures can be formed using polysilicon oxidation. The protection structures can protect the substrate of the semiconductor structure from being etched off in a later process or step (e.g., when the sacrificial layers are etched off).

At step 530, a contact opening for each contact hole of the contact holes is formed in the isolating layer. The contact opening can be one of the contact openings 472 of FIG. 4S. A width (e.g., 40-50 nm) of the contact opening is smaller than a width of the contact hole.

At step 532, the sacrificial material in the contact holes is removed. In some implementations, the sacrificial material includes carbon and can be burnt off.

At step 534, the sacrificial layers in the semiconductor structure are removed. In some implementations, the sacrificial layers can be removed by filling a third etchant (e.g., the etchant 474 described with respect to FIG. 4U) into the contact holes and the gate line trenches. The third etchant can have a faster etching rate for the sacrificial layers than the insulating layers, the protective layer, and the contact spacer layers.

At step 536, at least one conductive material is deposited into the multiple gate line trenches and the contact holes to form conductive layers (e.g., the conductive layers 476 of FIG. 4V) and contact structures (e.g., the contact structures 478 of FIG. 4V). The conductive layers can be between the insulating layers. The contact structures can extend through the connection region of the semiconductor structure in the first direction. In some implementations, each conductive layer of the conductive layers is connected to a corresponding contact structure of the contact structures and is isolated from one or more other contact structures of the contact structures. In some implementations, each contact structure of the contact structures includes a body and a head extending beyond the body. An end of the head can be in contact with an end of the body. The end of the body is wider than the end of the head. In some implementations, the conductive material includes tungsten.

At step 538, an inner surface of each of the multiple gate line trenches is etched to expose and recess the conductive layers.

At step 540, a part of an end of each of the contact structures is etched without creating an opening in the contact structure.

At step 542, a spacer layer (e.g., the spacer layer described with respect to FIG. 4W) is deposited to cover the inner surface of each of the multiple gate line trenches and the end of each of the contact structures. The spacer layer can isolate the conductive layers from each other.

Figure 6:
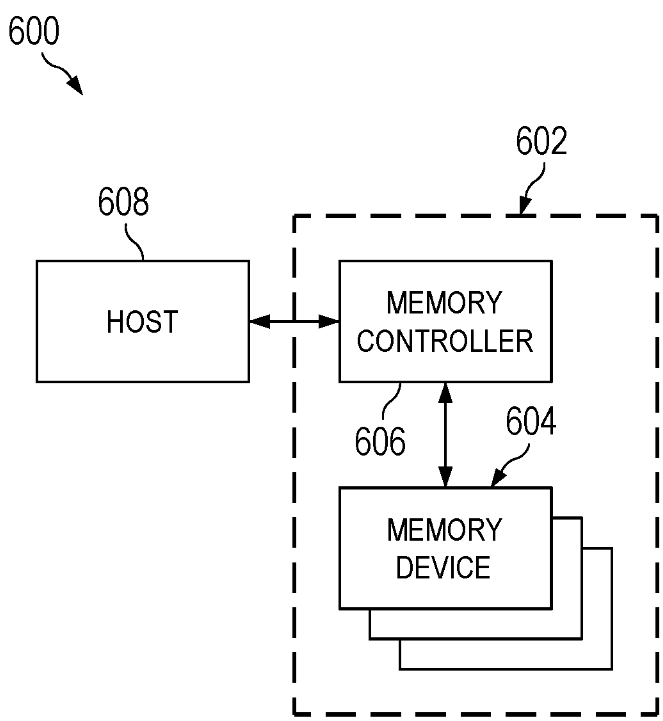
FIG. 6 illustrates a block diagram of an example system having one or more semiconductor devices, according to some aspects of the present disclosure.

FIG. 6 illustrates a block diagram of a system 600 having one or more semiconductor devices (e.g., memory devices), according to one or more implementations of the present disclosure. The system 600 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 6, the system 600 can include a host device 608 and a memory system 602 having one or more memory devices 604 and a memory controller 606. Host device 608 can include a processor of an electronic device, such as a central processing unit (CPU), or a system-on-chip (SoC), such as an application processor (AP). Host device 608 can be configured to send or receive data to or from the one or more memory devices 604.

A memory device 604 can be any memory device disclosed herein, such as a memory device (e.g., a 3D memory device) based on the semiconductor structures of FIGS. 1A-1B and 4A-4W. In some implementations, a memory device 604 includes a NAND Flash memory. Memory controller 606 (a.k.a., a controller circuit) is coupled to memory device 604 and host device 608. Consistent with implementations of the present disclosure, memory device 604 can include a plurality of conductive interconnections through a cover layer that are in contact with conductive pads in a conductive pad layer, and memory controller 606 can be coupled to memory device 604 through at least one of the plurality of conductive interconnections. Memory controller 606 is configured to control memory device 604. For example, memory controller 606 may be configured to operate a plurality of channel structures via word lines. Memory controller 606 can manage data stored in memory device 604 and communicate with host device 608.

In some implementations, memory controller 606 is designed/configured for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 606 is designed/configured for operating in a high duty cycle environment SSDs or embedded multi-media-cards (eMMCs) used as data storage for mobile devices, such as smartphones, tablets, laptop computers, etc., and enterprise storage arrays. Memory controller 606 can be configured to control operations of memory device 604, such as read, erase, and program (or write) operations. Memory controller 606 can also be configured to manage various functions with respect to the data stored or to be stored in memory device 604 including, but not limited to bad-block management, garbage collection, logical-to-physical address conversion, wear leveling, etc. In some implementations, memory controller 606 is further configured to process error correction codes (ECCs) with respect to the data read from or written to memory device 604. Any other suitable functions may be performed by memory controller 606 as well, for example, formatting memory device 604.

Memory controller 606 can communicate with an external device (e.g., host device 608) according to a particular communication protocol. For example, memory controller 606 may communicate with the external device through at least one of various interface protocols, such as a USB protocol, an MMC protocol, a peripheral component interconnection (PCI) protocol, a PCIexpress (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 606 and one or more memory devices 604 can be integrated into various types of storage devices, for example, be included in the same package, such as a universal Flash storage (UFS) package or an eMMC package. That is, memory system 602 can be implemented and packaged into different types of end electronic products. In one example as shown in FIG. 6, memory controller 606 and a single memory device 604 may be integrated into a memory card 602. Memory card 602 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc.

Implementations of the subject matter and the actions and operations described in this present disclosure can be implemented in digital electronic circuitry, in tangibly-embodied computer software or firmware, in computer hardware, including the structures disclosed in this present disclosure and their structural equivalents, or in combinations of one or more of them. Implementations of the subject matter described in this present disclosure can be implemented as one or more computer programs, e.g., one or more modules of computer program instructions, encoded on a computer program carrier, for execution by, or to control the operation of, data processing apparatus. The carrier may be a tangible non-transitory computer storage medium. Alternatively, or in addition, the carrier may be an artificially-generated propagated signal, e.g., a machine-generated electrical, optical, or electromagnetic signal, that is generated to encode information for transmission to suitable receiver apparatus for execution by a data processing apparatus. The computer storage medium can be or be part of a machine-readable storage device, a machine-readable storage substrate, a random or serial access memory device, or a combination of one or more of them. A computer storage medium is not a propagated signal.

It is noted that references in the present disclosure to "one embodiment," "an embodiment," "an example embodiment," "some implementations," "some implementations," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other implementations whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense.

Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

As used herein, the term "nominal/nominally" refers to a desired, or target, value of a characteristic or parameter for a component or a process step, set during the design phase of a product or a process, together with a range of values above and/or below the desired value. As used herein, the range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., .+−. 10%, .+−. 20%, or .+−. 30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

The present disclosure provides many different implementations, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include implementations in which the first and second features may be in direct contact, and may also include implementations in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various implementations and/or configurations discussed.

The foregoing description of the specific implementations can be readily modified and/or adapted for various applications. Therefore, such adaptations and modifications are intended to be within the meaning and range of equivalents of the disclosed implementations, based on the teaching and guidance presented herein.

While the present disclosure contains many specific implementation details, these should not be construed as limitations on the scope of what is being claimed, which is defined by the claims themselves, but rather as descriptions of features that may be specific to particular implementations of particular inventions. Certain features that are described in this present disclosure in the context of separate implementations can also be implemented in combination in a single embodiment. Conversely, various features that are described in the context of a single embodiment can also be implemented in multiple implementations separately or in any suitable sub-combination. Moreover, although features may be described above as acting in certain combinations and even initially be claimed as such, one or more features from a claimed combination can in some cases be excised from the combination, and the claim may be directed to a sub-combination or variation of a sub-combination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations also are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

The breadth and scope of the present disclosure should not be limited by any of the above-described exemplary implementations, but should be defined only in accordance with the following claims and their equivalents.

What is claimed is:

1. A semiconductor device, comprising:

a semiconductor structure comprising a stack of conductive layers and insulating layers alternating with each other along a first direction, wherein the semiconductor structure comprises an array region and a connection region adjacent to the array region in a second direction perpendicular to the first direction; and multiple contact structures extending through the connection region along the first direction, wherein each conductive layer in the stack of conductive layers and insulating layers is coupled to a corresponding contact structure of the multiple contact structures and isolated from one or more other contact structures of the multiple contact structures, and wherein each contact structure of the multiple contact structures comprises a body and a head extending beyond the body, an end of the head is in contact with an end of the body, and the end of the body is wider than the end of the head.

2. The semiconductor device of claim 1, wherein the body comprises an outer layer, an inner layer, and an intermediate layer between the outer layer and the inner layer, the head comprises an outer layer, an inner layer, and an intermediate layer between the outer layer and the inner layer, and the outer layer of the body, the intermediate layer of the body, and the inner layer of the body are continuously connected with the outer layer of the head, the intermediate layer of the head, and the inner layer of the head, respectively.

3. The semiconductor device of claim 2, wherein the outer layer of the body comprises a high-k dielectric material, the intermediate layer of the body comprises a titanium nitride material, the inner layer of the body comprises a conductive material, the outer layer of the head comprises a high-k dielectric material, the intermediate layer of the head comprises a titanium nitride material, and the inner layer of the head comprises a conductive material.

4. The semiconductor device of claim 1, wherein the contact structure extends through a set of conductive layers of the stack of conductive layers and insulating layers, wherein the contact structure is in contact with one conductive layer of the set of conductive layers that is closest to the head of the contact structure among the set of conductive layers, and wherein a contact spacer comprising a dielectric material is located between the contact structure and one or more other conductive layers of the set of conductive layers that are isolated from the contact structure.

5. The semiconductor device of claim 4, further comprising gate line slits and channel structures both extending through the semiconductor structure along the first direction.

6. The semiconductor device of claim 1, wherein the semiconductor structure comprises one or more decks that are sequentially stacked together along the first direction, and wherein the body of the contact structure comprises one or more segments that are sequentially connected together along the first direction, and each of the one or more segments is shaped like a truncated cone and corresponds to a respective deck of the one or more decks of the semiconductor structure.

* * * * *